United States Patent
Ju et al.

(10) Patent No.: US 11,631,770 B2
(45) Date of Patent: Apr. 18, 2023

(54) STRUCTURE AND FORMATION METHOD OF SEMICONDUCTOR DEVICE WITH STRESSOR

(71) Applicant: Taiwan Semiconductor Manufacturing Co., Ltd., Hsinchu (TW)

(72) Inventors: Shi-Ning Ju, Hsinchu (TW); Kuo-Cheng Chiang, Zhubei (TW); Guan-Lin Chen, Baoshan Township, Hsinchu County (TW); Chih-Hao Wang, Baoshan Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/834,440

(22) Filed: Mar. 30, 2020

(65) Prior Publication Data

US 2021/0135011 A1 May 6, 2021

Related U.S. Application Data

(60) Provisional application No. 62/928,644, filed on Oct. 31, 2019.

(51) Int. Cl.
*H01L 29/786* (2006.01)
*H01L 21/3105* (2006.01)
(Continued)

(52) U.S. Cl.
CPC .. *H01L 29/78618* (2013.01); *H01L 21/31055* (2013.01); *H01L 21/31155* (2013.01); *H01L 21/823418* (2013.01)

(58) Field of Classification Search
CPC .. H02J 50/12; H02J 50/80; H02J 50/60; H02J 7/025; H02J 7/007; H02J 7/00045; H02J 2310/22; G06F 3/041
See application file for complete search history.

(56) References Cited

U.S. PATENT DOCUMENTS

| 9,209,247 | B2 | 12/2015 | Colinge et al. |
| 9,236,267 | B2 | 1/2016 | De et al. |
| (Continued) | | | |

FOREIGN PATENT DOCUMENTS

| KR | 10-2015-0033496 A | 4/2015 |
| KR | 10-2018-0070316 A | 6/2018 |
| TW | 201203382 A1 | 1/2012 |

OTHER PUBLICATIONS

Korean Notice of Allowance for Korean Application No. 10-2020-0082201, dated May 31, 2021, with English translation.

*Primary Examiner* — Edward Chin
(74) *Attorney, Agent, or Firm* — Birch, Stewart, Kolasch & Birch, LLP

(57) ABSTRACT

A semiconductor device structure and a method for forming a semiconductor device structure are provided. The semiconductor device structure includes multiple semiconductor nanostructures over a substrate and two epitaxial structures over the substrate. Each of the semiconductor nanostructures is between the epitaxial structures, and the epitaxial structures are p-type doped. The semiconductor device structure also includes a gate stack wrapping around the semiconductor nanostructures. The semiconductor device structure further includes a dielectric stressor structure between the gate stack and the substrate. The epitaxial structures extend exceeding a top surface of the dielectric stressor structure.

20 Claims, 21 Drawing Sheets

(51) Int. Cl.
  *H01L 21/3115* (2006.01)
  *H01L 21/8234* (2006.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,332,803 B1 * | 6/2019 | Xie ................... H01L 29/42376 |
| 2012/0280211 A1 | 11/2012 | Cohen et al. |
| 2014/0167186 A1 | 6/2014 | Bhattacharyya et al. |
| 2017/0141188 A1 * | 5/2017 | Lee ................... H01L 29/66439 |
| 2019/0157422 A1 | 5/2019 | Reboh et al. |
| 2021/0119021 A1 * | 4/2021 | Colombeau ....... H01L 29/66439 |

* cited by examiner

STRUCTURE AND FORMATION METHOD OF SEMICONDUCTOR DEVICE WITH STRESSOR

PRIORITY CLAIM AND CROSS-REFERENCE

This application claims the benefit of U.S. Provisional Application No. 62/928,644, filed on Oct. 31, 2019, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
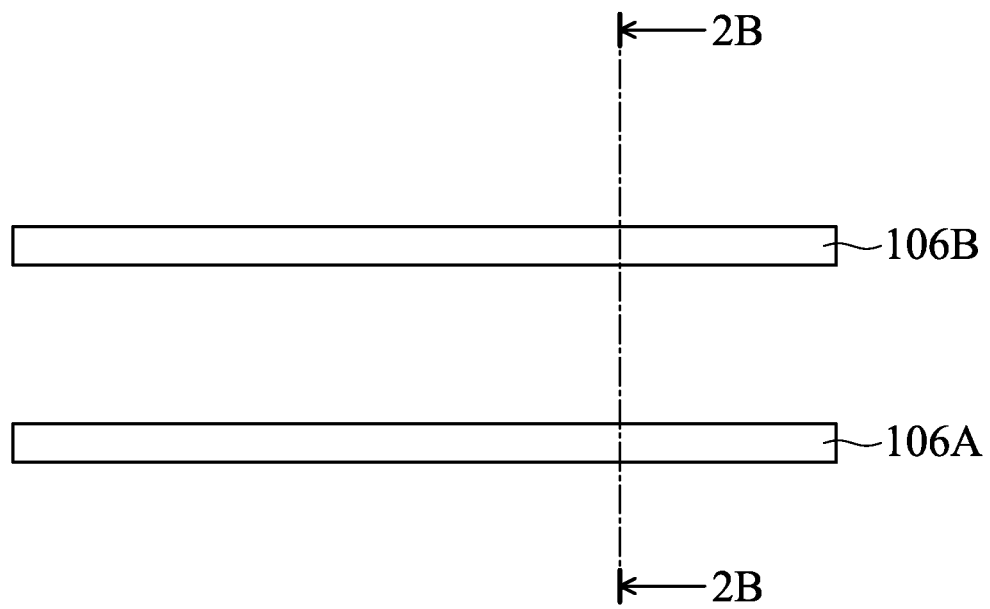
FIGS. 1A-1B are top views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
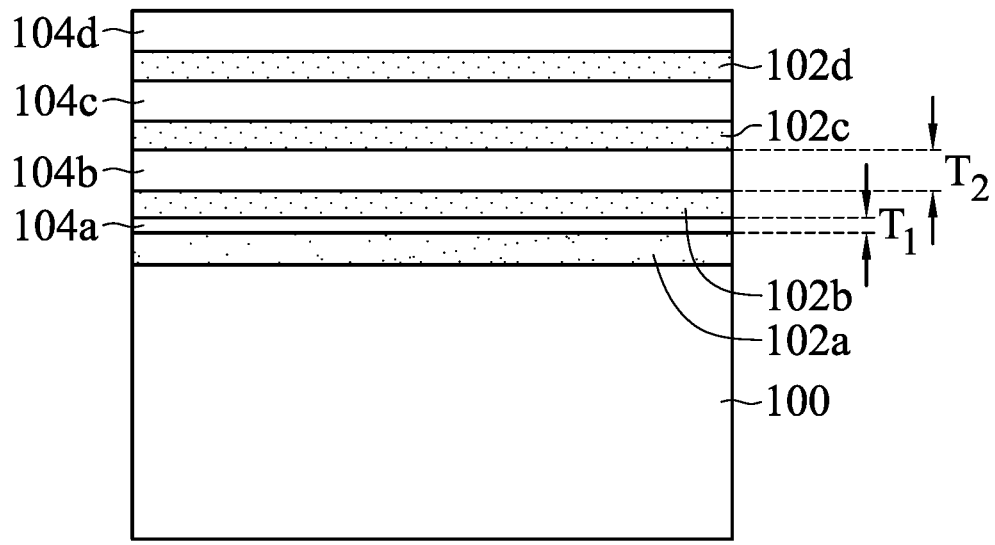
FIGS. 2A-2K are cross-sectional views of various stages of a process for forming a semiconductor device structure, in accordance with some embodiments.

FIGS. 2A-2K are cross-sectional views of various stages of a process for forming a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, 102c, and 102d, and the semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 2A.

In some embodiments, the semiconductor layer 102a is used as a sacrificial base layer and will be replaced with a dielectric stressor material in a subsequent process. In some embodiments, the semiconductor layer 104a functions as a protective layer that prevents the semiconductor layer 102b thereon from being damaged during the subsequent fabrication processes. In some embodiments, the semiconductor layer 104a is thinner than the semiconductor layer 104b, 104c, or 104d. In some embodiments, the semiconductor layers 102b-102d function as sacrificial layers that will be removed in a subsequent process to release the semiconductor layers 104b-104d. The semiconductor layers 104b-104d may function as channel structures of one or more transistors.

As shown in FIG. 2A, the semiconductor layer 104a has a thickness $T_1$, and the semiconductor layer 104b has a thickness $T_2$. In some embodiments, the thickness $T_2$ is greater than the thickness $T_1$. The thickness $T_1$ may be in a range from about 2 nm to about 6 nm. For example, the thickness $T_1$ is about 4 nm. The ratio ($T_1/T_2$) of the thickness $T_1$ to the thickness $T_2$ may be in a range from about 2/5 to about 2/3.

In some embodiments, each of the semiconductor layers 102a-102d and 104b-104d has substantially the same thickness. In some embodiments, each of the semiconductor layers 104b-104d is thicker than each of the semiconductor layers 102a-102d. In some other embodiments, each of the semiconductor layers 102a-102d is thicker than each of the semiconductor layers 104b-104d.

In some embodiments, the semiconductor layers 102a-102d and the semiconductor layers 104a-104d are made of different materials. In some embodiments, the semiconductor layers 102a-102d are made of or include silicon germanium or germanium, and the semiconductor layers 104a-104d are made of or include silicon.

In some embodiments, the semiconductor layer 102a has a different atomic concentration of germanium than that of the semiconductor layer 102b, 102c, or 102d. In some embodiments, the semiconductor layer 102a has a lower atomic concentration of germanium than that of the semiconductor layer 102b, 102c, or 102d. The atomic concentration of germanium of the semiconductor layer 102a may be in a range from about 10% to about 20%. The atomic concentration of germanium of the semiconductor layer 102b, 102c, or 102d may be in a range from about 25% to about 35%. The lower atomic concentration of germanium of the semiconductor layer 102a enables the semiconductor layer 102a to have different etching selectivity to the semiconductor layers 102b, 102c, and 102d.

In some embodiments, the semiconductor layers 102a-102d and the semiconductor layers 104a-104d are formed using multiple epitaxial growth operations. Each of the semiconductor layers 102a-102d and the semiconductor layers 104a-104d may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the semiconductor layers 102a-102d and the semiconductor layers 104a-104d are grown in-situ in the same process chamber. In some embodiments, the growth of the semiconductor layers 102a-102d and the growth of the semiconductor layers 104a-104d are alternately and sequentially performed in the same process chamber to complete the formation of the semiconductor stack. In some embodiments, the vacuum of the process chamber is not broken before the epitaxial growth of the semiconductor stack is accomplished.

Figure 2B:
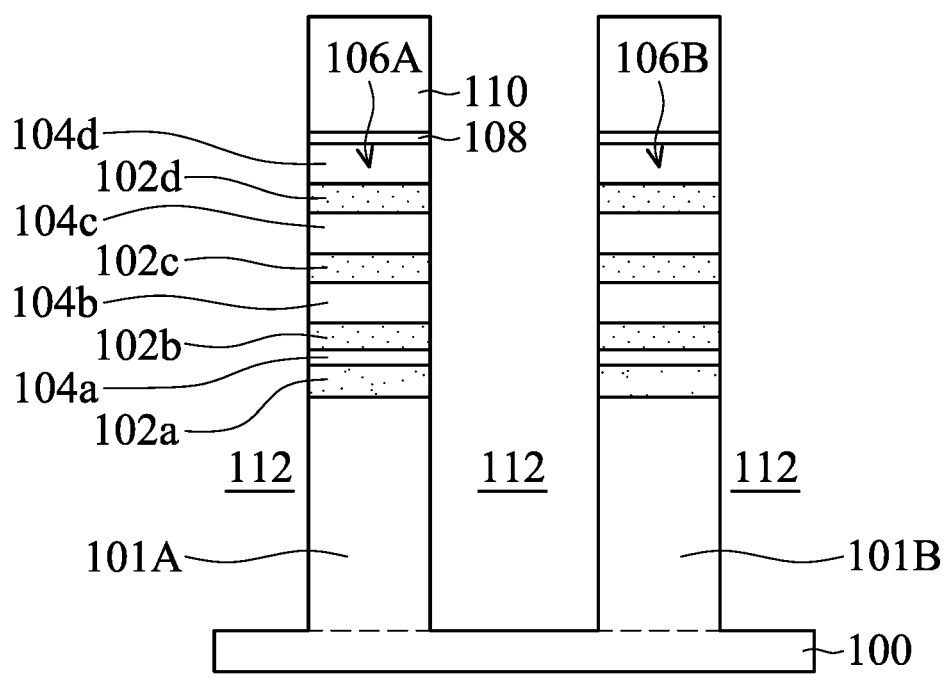

Afterwards, hard mask elements are formed over the semiconductor stack to assist in a subsequent patterning of the semiconductor stack. One or more etching processes are used to pattern the semiconductor stack into fin structures 106A and 106B, as shown in FIG. 2B in accordance with some embodiments. The semiconductor stack is partially removed to form trenches 112, as shown in FIG. 2B. Each of the fin structures 106A and 106B may include portions of the semiconductor layers 102a-102d and 104a-104d and semiconductor fins 101A and 101B. The semiconductor substrate 100 may also be partially removed during the etching process for forming the fin structures 106A and 106B. Protruding portions of the semiconductor substrate 100 that remain form the semiconductor fins 101A and 101B.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer 104d. The first mask layer 108 may be made of silicon oxide, germanium oxide, silicon germanium oxide, one or more other suitable materials, or a combination thereof. In some embodiments, the second mask layer 110 is made of a material that has good etching selectivity to the semiconductor layers 102a-102d and 104a-104d. The second mask layer 110 may be made of silicon nitride, silicon oxynitride, silicon carbide, one or more other suitable materials, or a combination thereof.

Figure 1B:
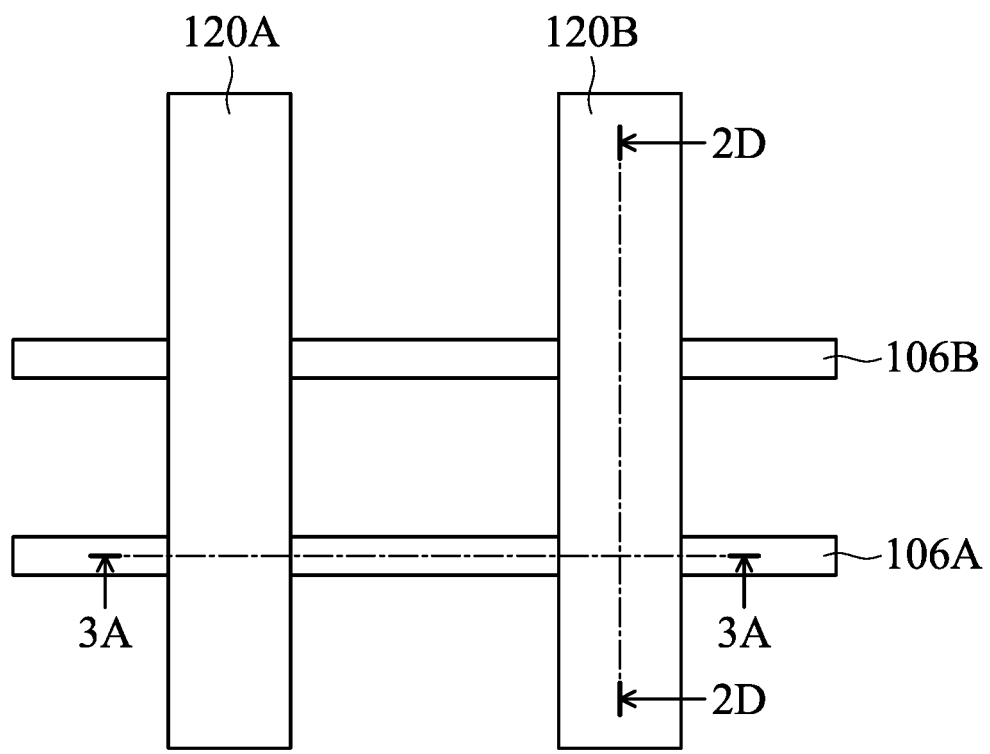

FIGS. 1A-1B are top views of various stages of a process for forming a semiconductor device structure, in accordance with some embodiments. In some embodiments, the extending directions of the fin structures 106A and 106B are substantially parallel to each other, as shown in FIG. 1A. In some embodiments, FIG. 2B is a cross-sectional view of the structure taken along the line 2B-2B in FIG. 1A.

Figure 2C:
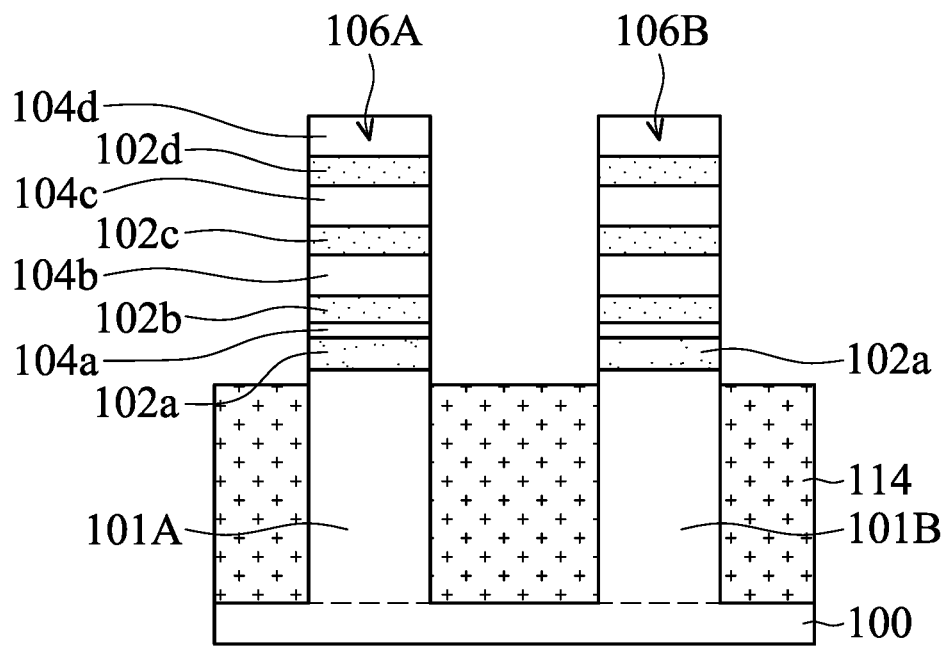

As shown in FIG. 2C, an isolation structure 114 is formed to surround lower portions of the fin structures 106A and 106B, in accordance with some embodiments. In some embodiments, one or more dielectric layers are deposited over the fin structures 106A and 106B and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The dielectric layers may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof. Afterwards, one or more etching back processes are used to partially remove the dielectric layers. As a result, the remaining portion of the dielectric layers forms the isolation structure 114. Upper portions of the fin structures 106A and 106B protrude from the top surface of the isolation structure 114, as shown in FIG. 2C.

In some embodiments, the etching back process for forming the isolation structure 114 is carefully controlled to ensure that the top surface of the isolation structure 114 is lower than the top surface of the semiconductor layer 102a, as shown in FIG. 2C. The sidewalls of the semiconductor layer 102a are thus exposed without being covered by the isolation structure 114, which facilitates a subsequent removing process of the semiconductor layer 102a. Afterwards, the hard mask elements (including the first mask layer 108 and the second mask layer 110) are removed. Alternatively, in some other embodiments, the hard mask elements are removed or consumed during the planarization process and/or the etching back process.

Figure 2D:
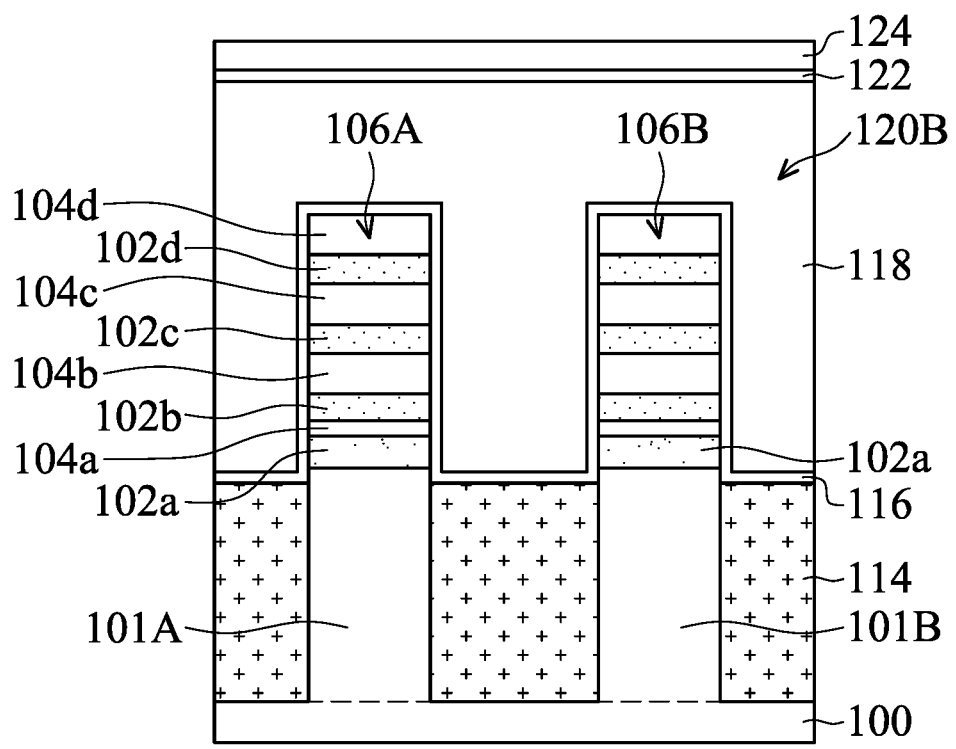
Figure 3A:
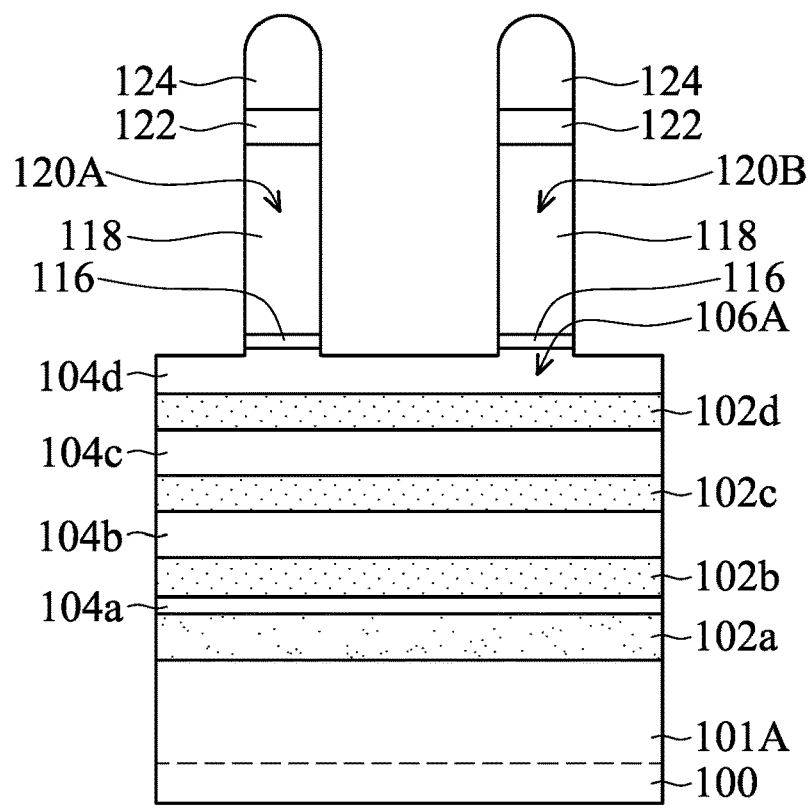
FIGS. 3A-3O are cross-sectional views of various stages of a process for forming a semiconductor device structure, in accordance with some embodiments.

Afterwards, dummy gate stacks 120A and 120B are formed to extend across the fin structures 106A and 106B, as shown in FIG. 1B in accordance with some embodiments. In some embodiments, FIG. 2D is a cross-sectional view of the structure taken along the line 2D-2D in FIG. 1B. FIGS. 3A-3N are cross-sectional views of various stages of a process for forming a semiconductor device structure, in accordance with some embodiments. In some embodiments, FIG. 3A is a cross-sectional view of the structure taken along the line 3A-3A in FIG. 1B.

As shown in FIGS. 1B, 2D, and 3A, the dummy gate stacks 120A and 120B are formed to partially cover and to extend across the fin structures 106A and 106B, in accordance with some embodiments. In some embodiments, the dummy gate stacks 120A and 120B wraps around the fin structures 106A and 106B. As shown in FIG. 2D, the dummy gate stack 120B extends across and wraps around the fin structures 106A and 106B.

As shown in FIGS. 2D and 3A, each of the dummy gate stacks 120A and 120B includes a dummy gate dielectric layer 116 and a dummy gate electrode 118. The dummy gate dielectric layers 116 may be made of or include silicon oxide. The dummy gate electrodes 118 may be made of or include polysilicon. In some embodiments, a dummy gate dielectric material layer and a dummy gate electrode layer are sequentially deposited over the isolation structure 114 and the fin structures 106A and 106B. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate dielectric layers 116 and the dummy gate electrodes 118 of the dummy gate stacks 120A and 120B, respectively.

Figure 3B:
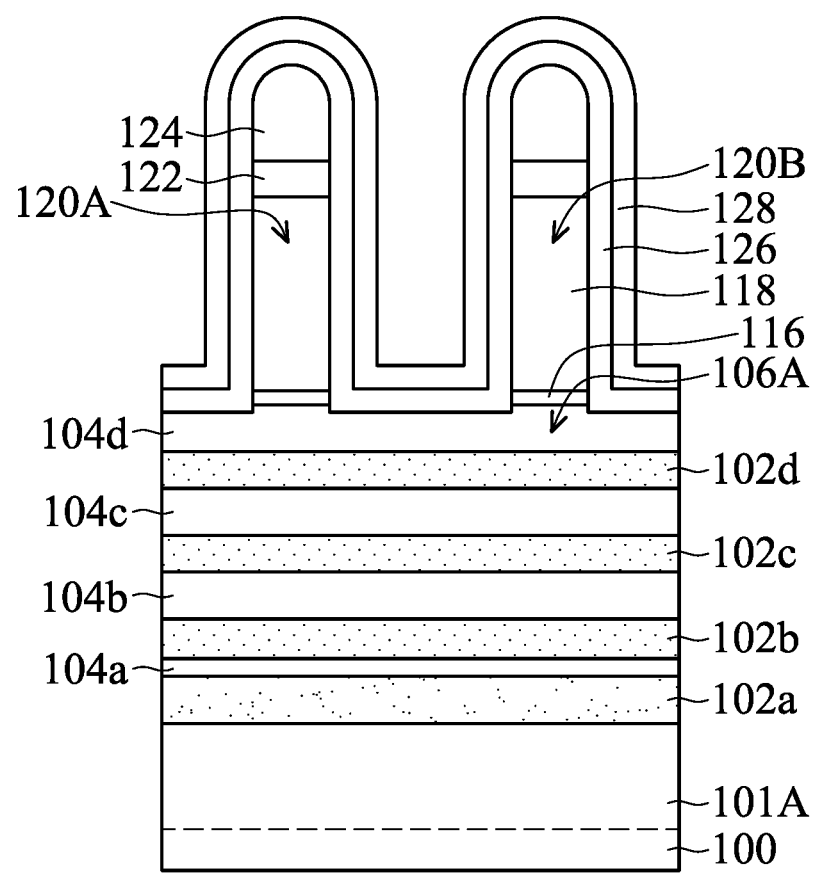

As shown in FIG. 3B, spacer layers 126 and 128 are afterwards deposited over the structure shown in FIG. 3A, in accordance with some embodiments. The spacer layers 126 and 128 extend along the sidewalls of the dummy gate stacks 120A and 120B. The spacer layers 126 and 128 are made of different materials. The spacer layer 126 may be made of a dielectric material that has a low dielectric constant. The spacer layer 126 may be made of or include silicon carbide, silicon oxycarbide, silicon oxide, one or more other suitable materials, or a combination thereof. The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

Figure 3C:
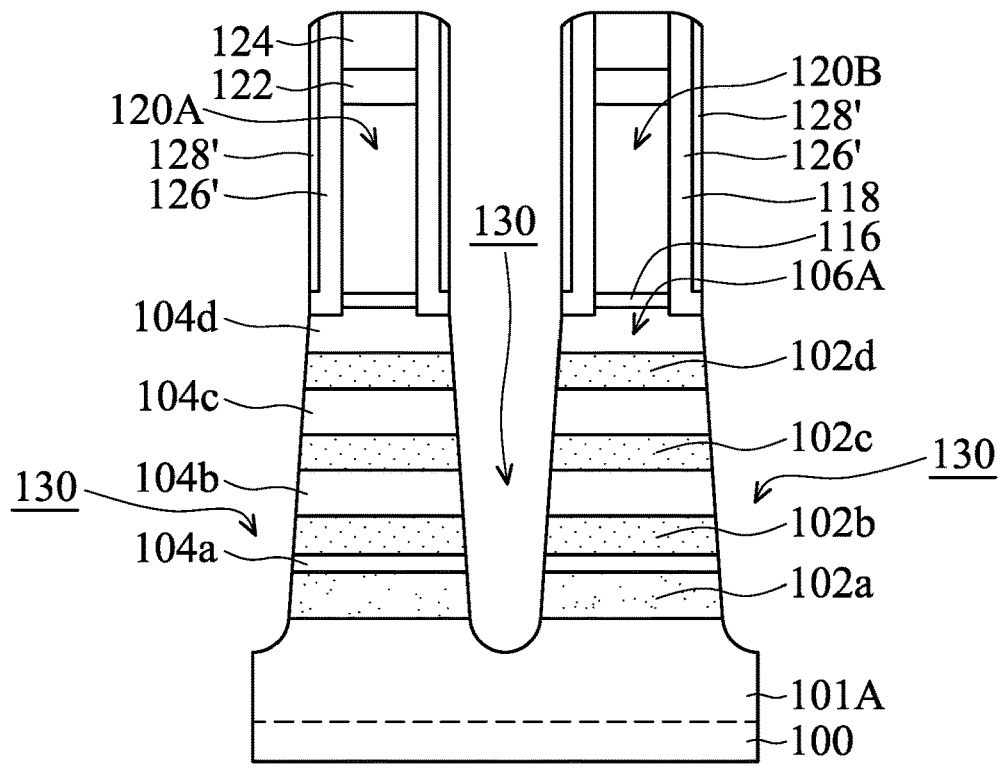

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120A and 120B, as shown in FIG. 3C.

The fin structures 106A and 106B are partially removed to form recesses 130 that are used to contain epitaxial structures (such as source/drain structures) that will be formed later. As shown in FIG. 3C, the fin structure 106A is partially removed to form the recesses 130, in accordance with some embodiments. One or more etching processes may be used to form the recesses 130. In some embodiments, a dry etching process is used to form the recesses 130. Alternatively, a wet etching process may be used to form the recesses 130. In some embodiments, each of the recesses 130 penetrates through the fin structure 106A. In some embodiments, the recesses 130 further extend into the semiconductor fin 101A, as shown in FIG. 3C. In some embodiments, the spacer elements 126' and 128' and the recesses 130 are simultaneously formed using the same etching process.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104d) is shorter than a lower semiconductor layer (such as the semiconductor layer 104b).

However, embodiments of the disclosure have many variations. In some other embodiments, the recesses 130 have substantially vertical sidewalls. In these cases, due to the profile of the recesses 130, an upper semiconductor layer (such as the semiconductor layer 104d) is substantially as wide as a lower semiconductor layer (such as the semiconductor layer 104b).

Figure 3D:
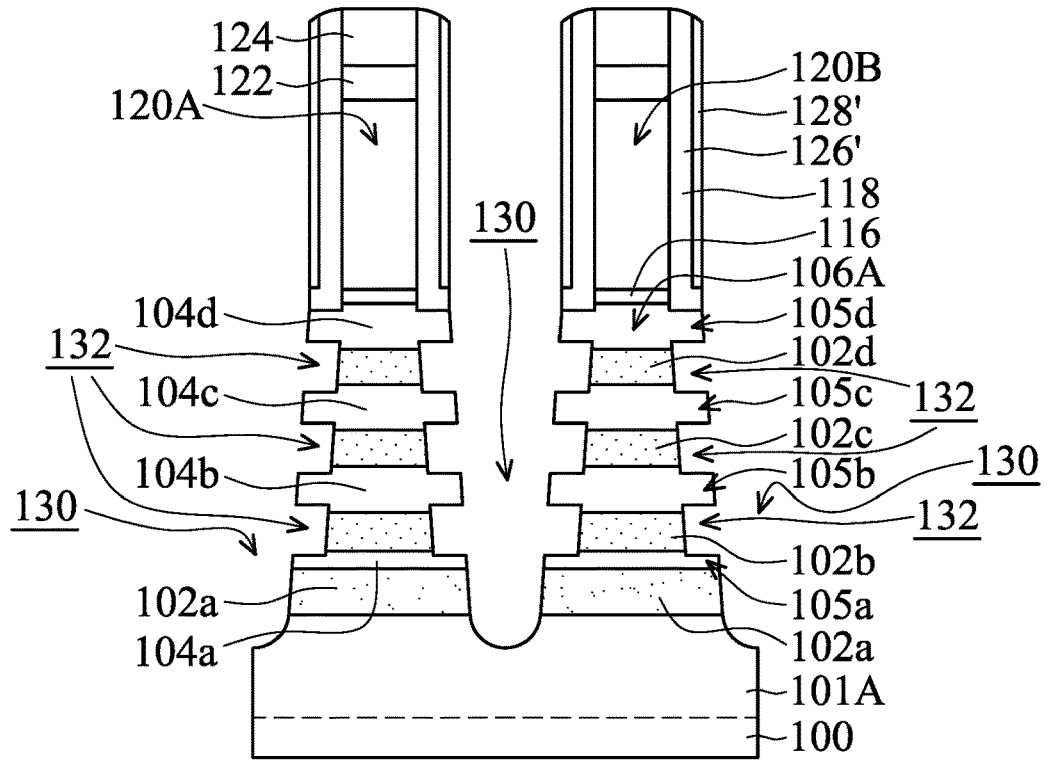

As shown in FIG. 3D, the semiconductor layers 102b-102d are laterally etched, in accordance with some embodiments. As a result, edges of the semiconductor layers 102b-102d retreat from edges of the semiconductor layers 104a-104d. As shown in FIG. 3D, recesses 132 are formed due to the lateral etching of the semiconductor layers 102b-102d. The recesses 132 may be used to contain inner spacers that will be formed later. The semiconductor layers 102b-102d may be laterally etched using a wet etching process, a dry etching process, or a combination thereof.

As mentioned above, in some embodiments, the semiconductor layer 102a has a lower atomic concentration of germanium than that of the semiconductor layer 102b, 102c, or 102d. In some embodiments, the semiconductor layers 102a may slightly (or substantially not) be etched during the lateral etching of the semiconductor layers 102b-102d. As a result, there is substantially no recess formed at the sidewalls of the semiconductor layer 102a, as shown in FIG. 3D in accordance with some embodiments.

During the lateral etching of the semiconductor layers 102b-102d, the semiconductor layers 104a-104d may also be slightly etched. As a result, edge portions of the semiconductor layers 104a-104d are partially etched and thus shrink to become edge elements 105a-105d, as shown in FIG. 3D. As shown in FIG. 3D, each of the edge elements 105a-105d of the semiconductor layers 104a-104d is thinner than the corresponding inner portion of the semiconductor layers 104a-104d. In some embodiments, each of the edge elements 105a is thinner than another upper edge element such as the edge elements 105b-105d.

Figure 3E:
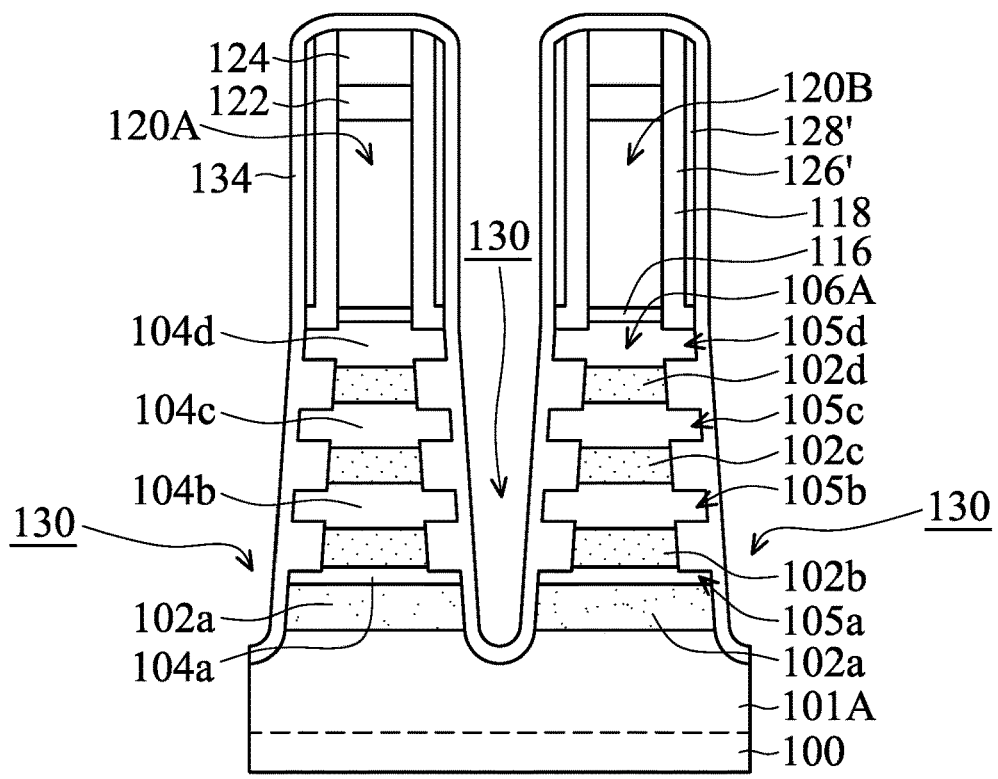

As shown in FIG. 3E, a spacer layer 134 is deposited over the structure shown in FIG. 3D, in accordance with some embodiments. The spacer layer 134 covers the dummy gate stacks 120A and 120B and overfills the recesses 132. The spacer layer 134 may be made of or include carbon-containing silicon nitride (SiCN), carbon-containing silicon oxynitride (SiOCN), carbon-containing silicon oxide (SiOC), one or more other suitable materials, or a combination thereof. The spacer layer 134 may be deposited using a CVD process, an ALD process, one or more other applicable processes, or a combination thereof.

Figure 3F:
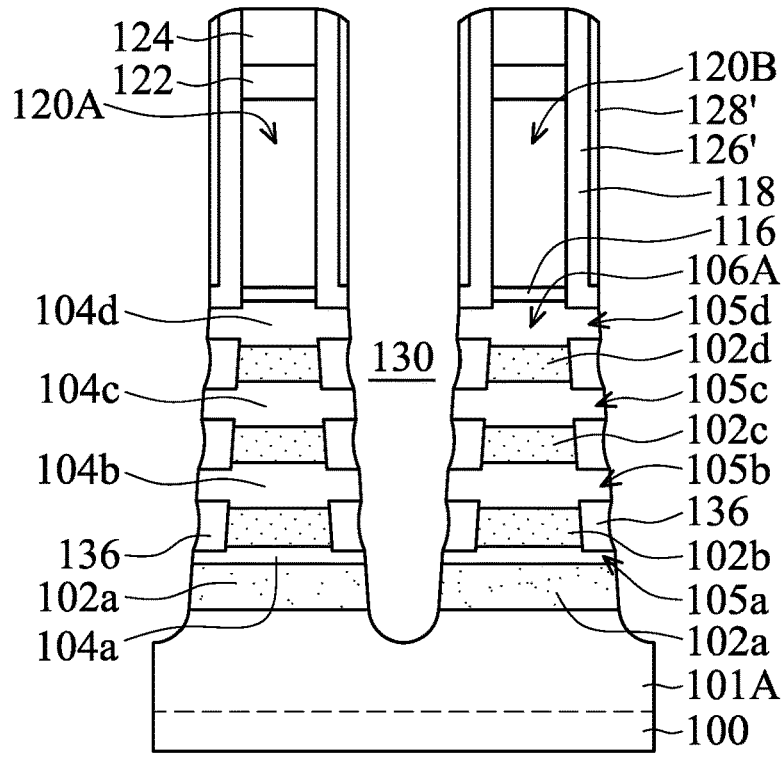

As shown in FIG. 3F, an etching process is used to partially remove the spacer layer 134, in accordance with some embodiments. The remaining portions of the spacer layer 134 form inner spacers 136, as shown in FIG. 3F. The etching process may include a dry etching process, a wet etching process, or a combination thereof.

The inner spacers 136 cover the edges of the semiconductor layers 102b-102d that are originally exposed by the recesses 132. The inner spacers 136 may be used to prevent subsequently formed epitaxial structures (that function as, for example, source/drain structures) from being damaged during a subsequent removing process of the sacrificial layers 102b-102d. The inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fin 101A originally covered by the spacer layer 134 are exposed by the recesses 130, as shown in FIG. 3F. Similarly, the sidewalls of the semiconductor layer 102a, that are originally covered by the spacer layer 134, are also exposed by the recesses 130, as shown in FIG. 3F. The inner spacers 136 are prevented from being formed over the sidewalls of the semiconductor layer 102a, which facilitates to a subsequent removing process of the semiconductor layer 102a.

Figure 2E:
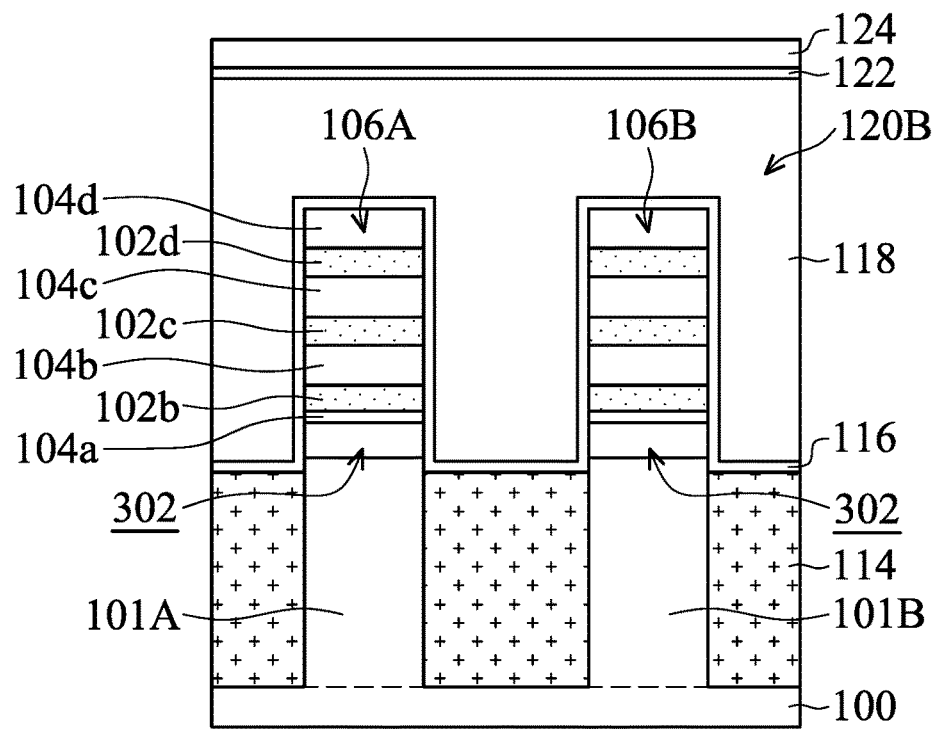
Figure 3G:
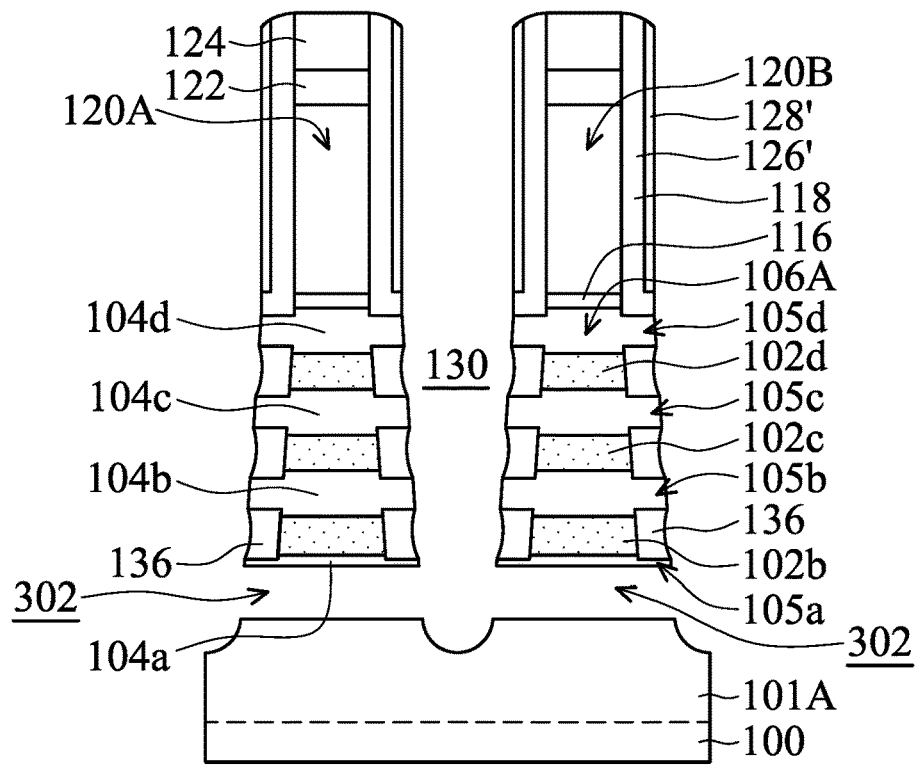

As shown in FIGS. 2E and 3G, the semiconductor layer 102a is removed to form recesses 302 between the semiconductor layer 104a and the semiconductor fin 101A or 101B, in accordance with some embodiments. Due to the support of the dummy gate stacks 120A and 120B, the fin structures 106A and 106B are prevented from falling down even if the semiconductor layer 102a is removed. The semiconductor layer 102a may be removed using a dry etching process, a wet etching process, or a combination thereof.

As shown in FIG. 3G, due to the protection of the inner spacers 136 and the semiconductor layer 104a (that function as a protective layer), the semiconductor layers 102b-102d are prevented from being etched during the removal of the semiconductor layer 102a. In some embodiments, the semiconductor layer 104a and the edge elements 105a become thinner since they are also slightly etched during the removal of the semiconductor layer 102a, as shown in FIGS. 2E and 3G.

Figure 2F:
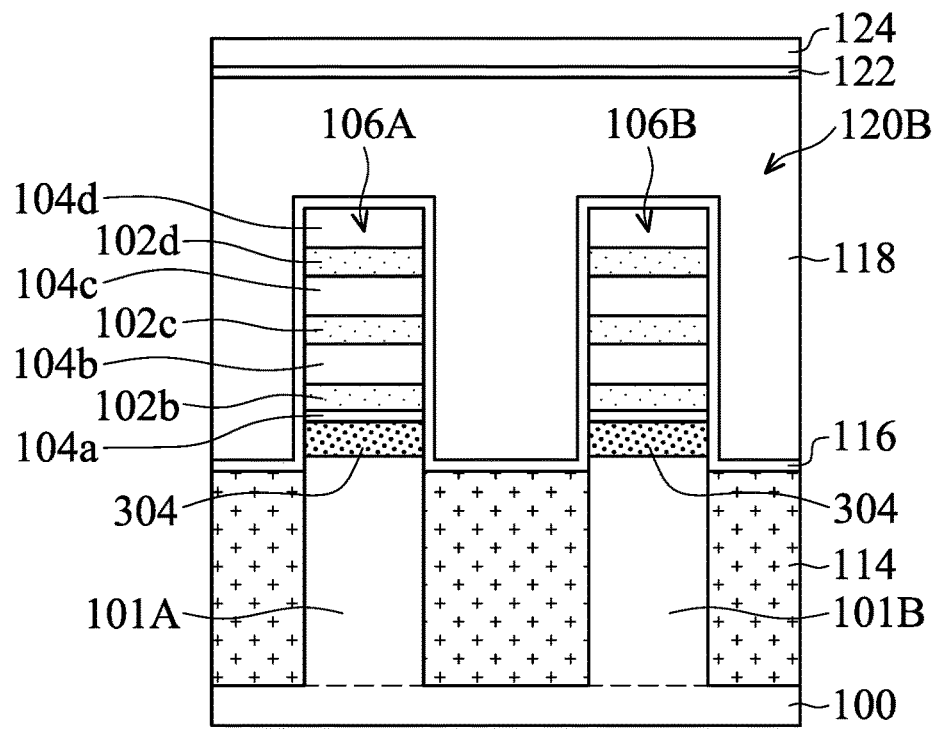
Figure 3H:
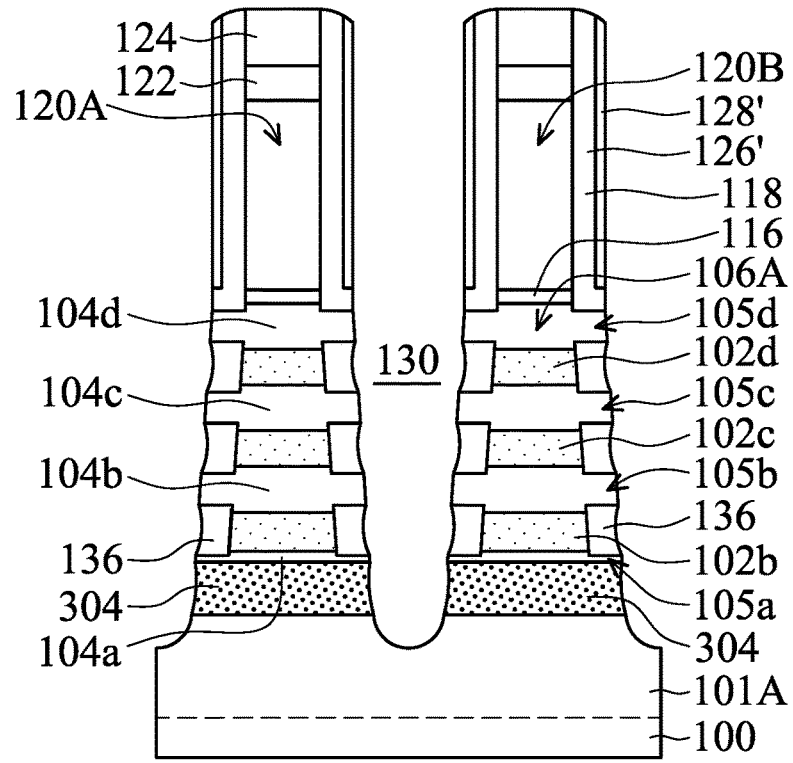

As shown in FIGS. 2F and 3H, dielectric stressor structures 304 are formed in the recesses 302, in accordance with some embodiments. As shown in FIGS. 2D-2F and 3F-3H, the semiconductor layer 102a (that functions as a sacrificial base layer) is replaced with the dielectric stressor structures 304. In some embodiments, the dielectric stressor structures 304 are made of a dielectric material that shrinks or becomes denser if being annealed. The dielectric stressor structures 304 may be made of or include silicon nitride (SiN), carbon-containing silicon nitride (SiCN), carbon-containing silicon oxynitride (SiOCN), carbon-containing silicon oxide (SiOC), one or more other suitable materials, or a combination thereof. In some embodiments, the dielectric stressor structures 304 are made of a dielectric material that is different than that of the inner spacers 136. Alternatively, in some other embodiments, the dielectric stressor structures 304 and the inner spacers 136 are made of the same material.

In some embodiments, a dielectric stressor layer is deposited over the structure shown in FIG. 3G or 2E to fill the recesses 302. The dielectric stressor layer may also extend along the sidewalls of the recesses 130 and the tops of the dummy gate stacks 120A and 120B. The dielectric stressor layer may be deposited using an ALD process, a CVD process, an FCVD process, one or more other applicable processes, or a combination thereof. Afterwards, an anisotropic etching process is used to partially remove the dielectric stressor layer. As a result, the portions of the dielectric stressor layer outside of the recesses 302 are substantially removed. The remaining portions of the dielectric stressor layer form the dielectric stressor structures 304, as shown in FIGS. 2F and 3H.

Figure 3I:
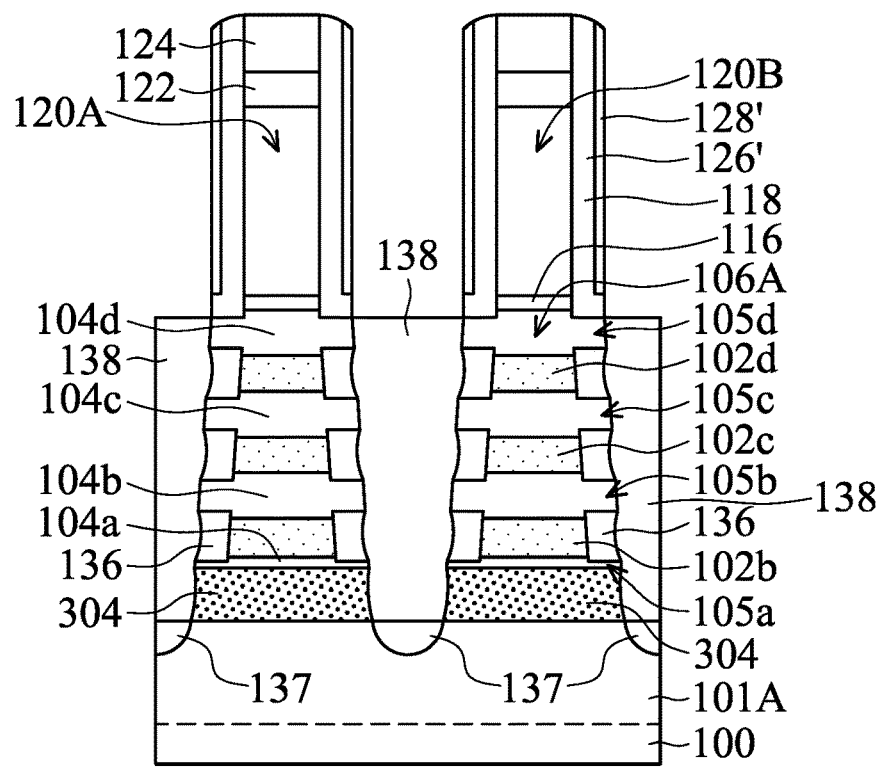

As shown in FIG. 3I, epitaxial structures 138 are formed beside the dummy gate stacks 120A and 120B, in accordance with some embodiments. In some embodiments, the epitaxial structures 138 fill the recesses 130, as shown in FIG. 3I. In some other embodiments, the epitaxial structures 138 overfill the recesses 130. In these cases, the top surfaces of the epitaxial structures 138 may be higher than the top surface of the dummy gate dielectric layer 116. In some other embodiments, the epitaxial structures 138 partially fill the recesses 130.

In some embodiments, the epitaxial structures 138 connect to the semiconductor layers 104a-104d. Each of the semiconductor layers 104a-104d is sandwiched between two of the epitaxial structures 138. In some embodiments, the epitaxial structures 138 function as source/drain structures. In some embodiments, the epitaxial structures 138 are p-type doped regions. The epitaxial structures 138 may include epitaxially grown silicon germanium (SiGe), epitaxially grown silicon, or another suitable epitaxially grown semiconductor material.

In some embodiments, the epitaxial structures 138 are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 138 are doped with one or more suitable dopants. For example, the epitaxial structures 138 are SiGe source/drain features or Si source/drain features that are doped with boron (B), gallium (Ga), indium (In), or another suitable dopant.

In some embodiments, before the formation of the epitaxial structures 138, isolation elements 137 are formed to fill bottom portions of the recesses 130, as shown in FIG. 3I. The isolation elements 137 are used to prevent or reduce current leakage from the epitaxial structures 138. In some embodiments, the isolation elements 137 are made of a semiconductor material. The isolation elements 137 may be made of or include silicon germanium, silicon, one or more other suitable materials, or a combination thereof. In some embodiments, doping concentration of the isolation elements 137 is much lower than that of the epitaxial structures 138. Therefore, current from the epitaxial structures 138 is isolated by the isolation elements 137 and is prevented from entering the semiconductor fins 101A or 101B. In some other embodiments, the isolation elements 137 contain substantially no dopant. In these cases, the doping concentration of isolation elements 137 is substantially equal to zero.

In some embodiments, the isolation elements 137 and the epitaxial structures 138 are formed in-situ in the same process chamber without breaking the vacuum of the process chamber after the formation of the isolation elements 137 and before the formation of the epitaxial structures 138.

In some embodiments, the epitaxial structures 138 are doped in-situ during their epitaxial growth. The initial reaction gas mixture for forming the epitaxial structures 138 contains dopants. In some other embodiments, the epitaxial structures 138 are not doped during the growth of the epitaxial structures 138. Instead, after the formation of the epitaxial structures 138, the epitaxial structures 138 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138 are further exposed to one or more annealing processes to activate the dopants. For example, a rapid thermal annealing process is used.

Figure 3J:
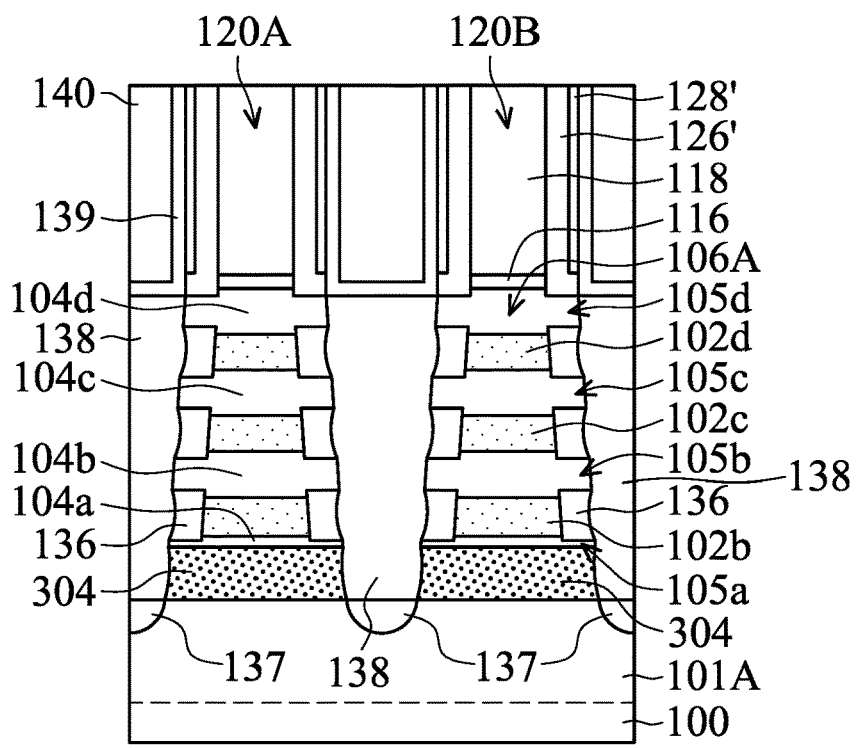

As shown in FIG. 3J, a contact etch stop layer 139 and a dielectric layer 140 are formed to cover the epitaxial structures 138 and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3I. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer form the contact etch stop layer 139 and the dielectric layer 140, respectively. The planarization process may include a CMP process, a grinding process, an etching process, a dry polishing process, one or more other applicable processes, or a combination thereof. In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially coplanar.

Figure 2G:
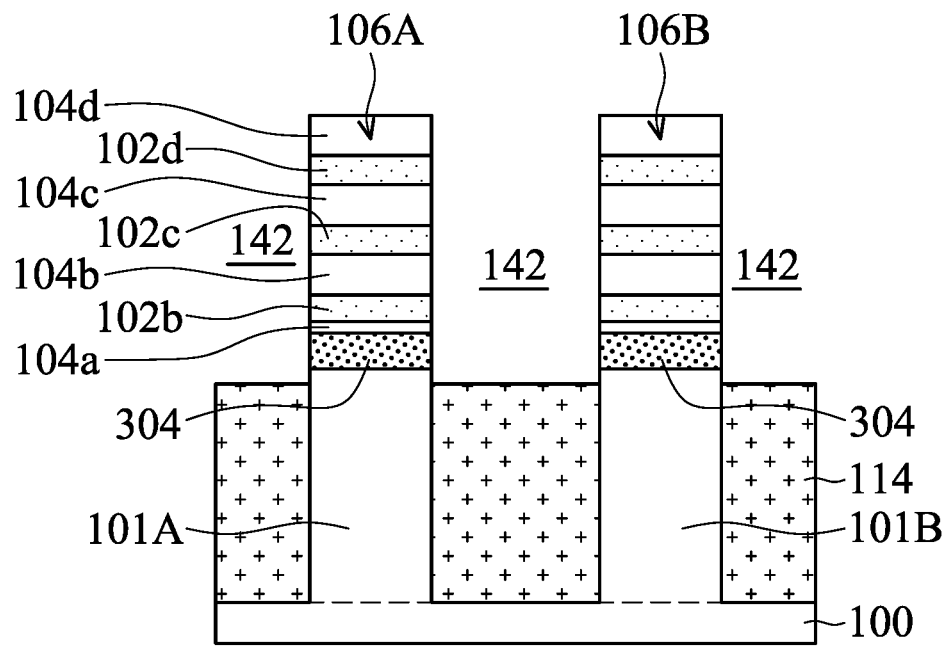
Figure 3K:
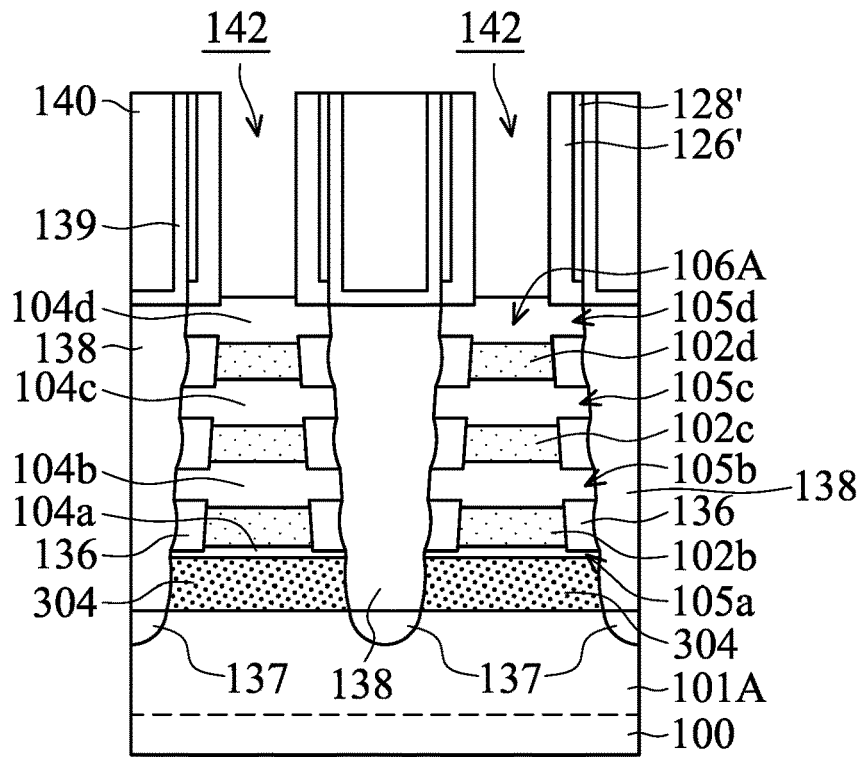

As shown in FIGS. 2G and 3K, one or more etching processes are used to remove the dummy gate stacks 120A and 120B to form trenches 142, in accordance with some embodiments. The trenches 142 expose the dielectric stressor structures 304 and the semiconductor layers 102b-102d and 104a-104d that are originally covered by the dummy gate stacks 120A and 120B and the epitaxial structures 138.

Figure 2H:
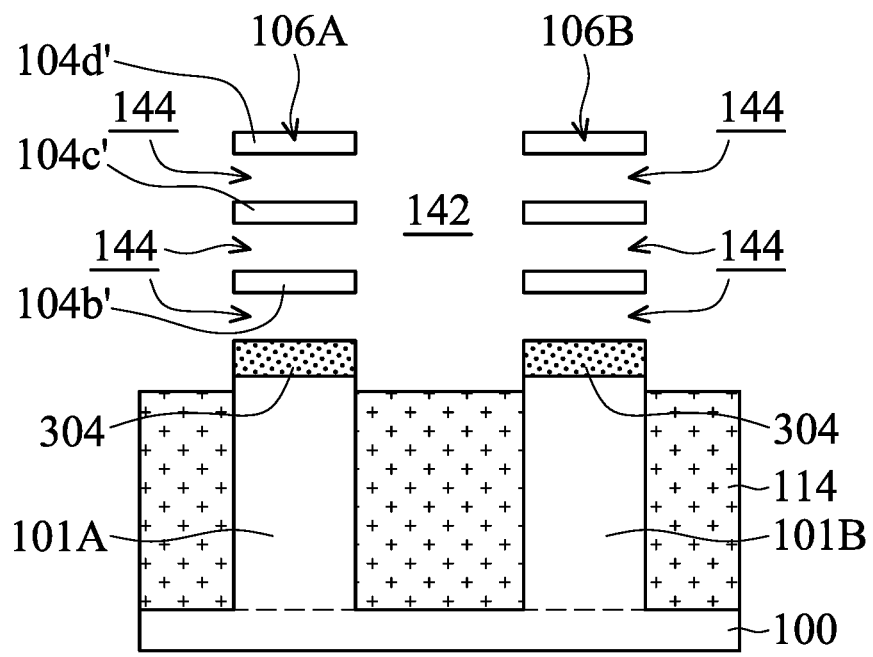
Figure 3L:
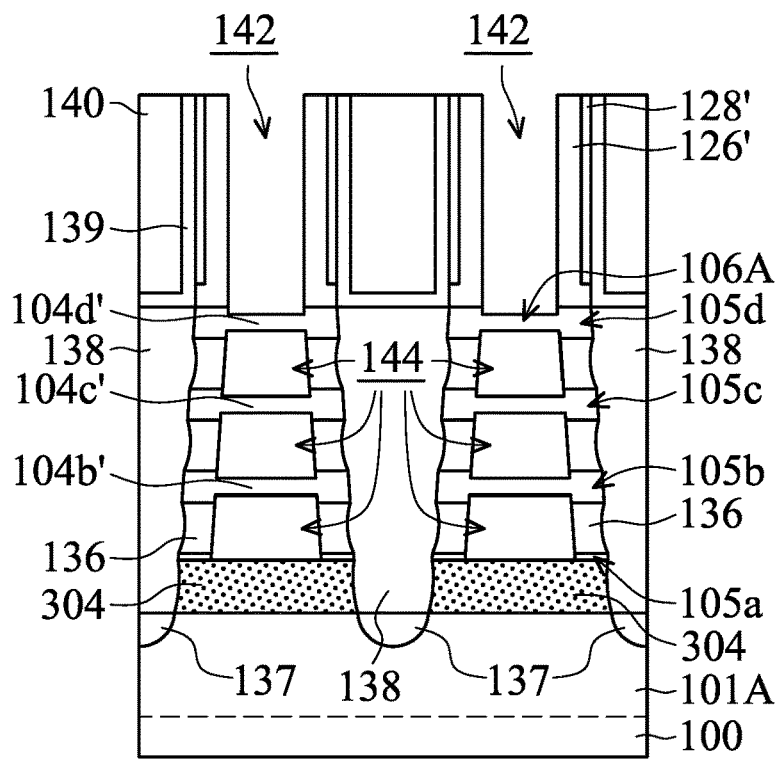

As shown in FIGS. 2H and 3L, the semiconductor layers 102b-102d (that function as sacrificial layers) are removed to form recesses 144, in accordance with some embodiments. In some embodiments, an etching process is used to remove the semiconductor layers 102b-102d. Due to high etching selectivity, the semiconductor layers 104b-104d are slightly (or substantially not) etched. The remaining portions of the semiconductor layers 104b-104d form multiple semiconductor nanostructures 104b'-104d' of the fin structures 106A and 106B, as shown in FIGS. 2H and 3L. The semiconductor nanostructures 104b'-104d' are constructed by or made up of the remaining portions of the semiconductor layer 104b-104d. The semiconductor nanostructures 104b'-104d' suspended over the semiconductor fin 101A or 101B may function as channel structures of transistors.

In some embodiments, the etchant used for removing the semiconductor layers 102b-102d also slightly removes the semiconductor layers 104b-104d that form the semiconductor nanostructures 104b'-104d'. As a result, the obtained semiconductor nanostructures 104b'-104d' become thinner after the removal of the semiconductor layers 102b-102d. In some embodiments, each of the semiconductor nanostructures 104b'-104d' is thinner than the edge portions 105b-105d since the edge portions 105b-105d are surrounded by other elements and thus are prevented from being reached and etched by the etchant.

In some embodiments, the etchant used for removing the semiconductor layers 102b-102d etches through the semiconductor layer 104a that is thinner than the semiconductor layer 104b, 104c, or 104d. As a result, the dielectric stressor structures 304 are exposed. In some embodiments, edge portions 105a still remain without being completely removed, as shown in FIG. 3L.

After the removal of the semiconductor layers 102b-102d (that function as sacrificial layers), recesses 144 are formed. The recesses 144 connect to the trench 142 and surround each of the semiconductor nanostructures 104b'-104d'. As shown in FIG. 3L, even if the recesses 144 between the semiconductor nanostructures 104b'-104d' are formed, the semiconductor nanostructures 104b'-104d' remain being held by the epitaxial structures 138. Therefore, after the removal of the semiconductor layers 102b-102d (that function as sacrificial layers), the released semiconductor nanostructures 104b'-104d' are prevented from falling down.

During the removal of the semiconductor layers 102b-102d (that function as sacrificial layers), the inner spacers 136 protect the epitaxial structures 138 from being etched or damaged. The quality and reliability of the semiconductor device structure are improved.

As mentioned above, in some embodiments as illustrated in FIG. 2A, the ratio ($T_1/T_2$) of the thickness $T_1$ of the semiconductor layer 104a (that afterwards functions as a protective layer to the semiconductor layer 102b during the process illustrated in FIGS. 2E and 3G) to the thickness $T_2$ of the semiconductor layer 104b (that afterwards becomes the nanostructure 104b') may be in a range from about ⅖ to about ⅔. In some cases, if the thickness ratio ($T_1/T_2$) is lower than about ⅖, the semiconductor layer 104a with the thickness $T_1$ may be too thin. As a result, during the removal of the semiconductor layer 102a (which function as sacrificial base layer) as illustrated in FIGS. 2E and 3G, the semiconductor layer 104a may be broken or completely removed, exposing the semiconductor layer 102b above it to the etchant. The semiconductor layer 102b may be damaged or removed. As a result, the dielectric stressor structures 304 that are formed later may occupy the space that is designed to contain the semiconductor layer 102b. The subsequent processes may become hard to perform.

In some other cases, if the thickness ratio ($T_1/T_2$) is greater than about ⅔, the semiconductor layer 104a with the thickness $T_1$ may be too thick. As a result, additional or heavier etching process may need to be used in the process illustrated in FIG. 3L so as to expose the dielectric stressor structures 304. The process time may become longer. The additional or heavier etching process may also damage other elements (such as channel structures) that have been formed. The performance of the semiconductor device structure might be negatively affected.

Figure 2I:
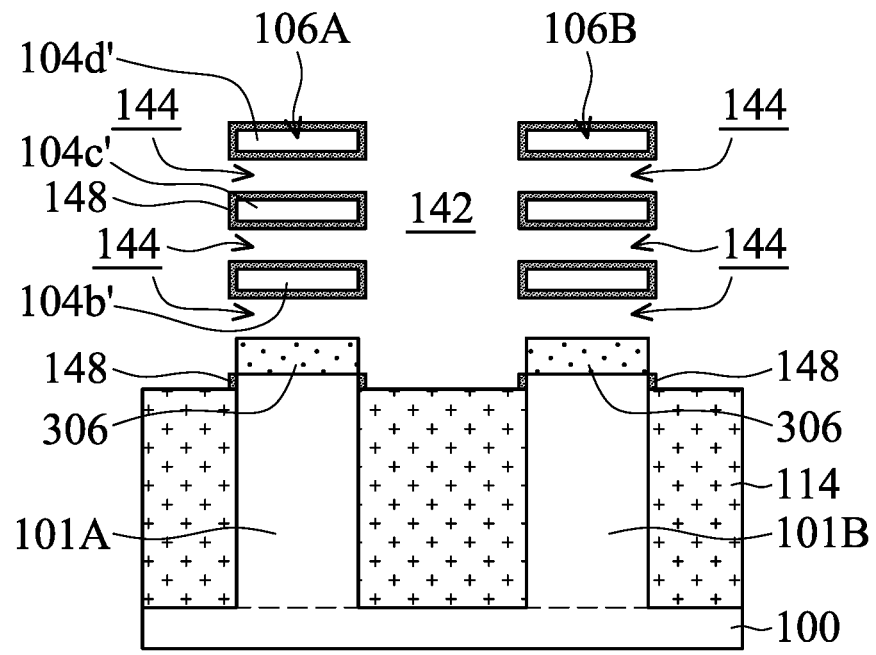
Figure 3M:
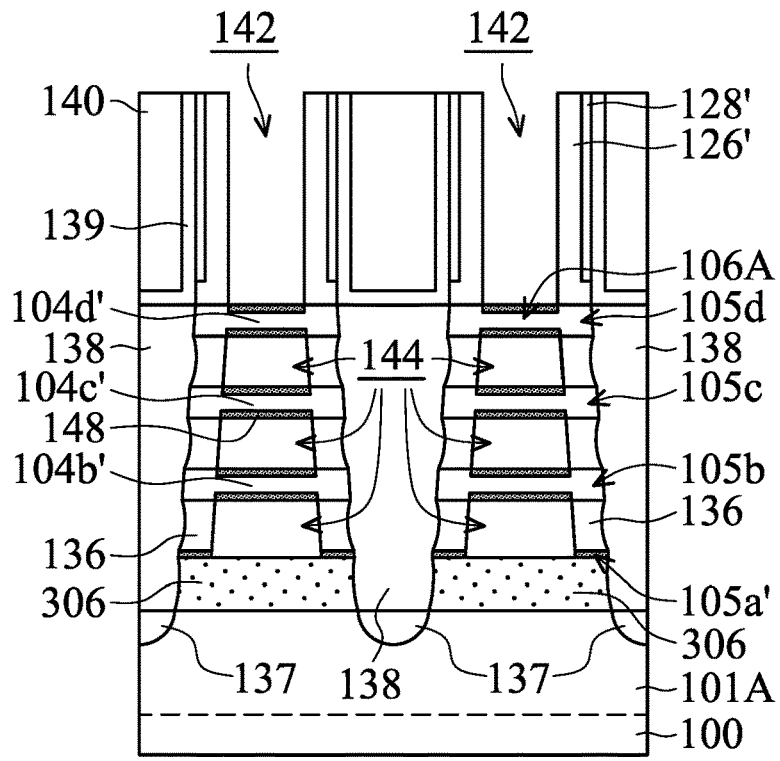
Figure 3N:
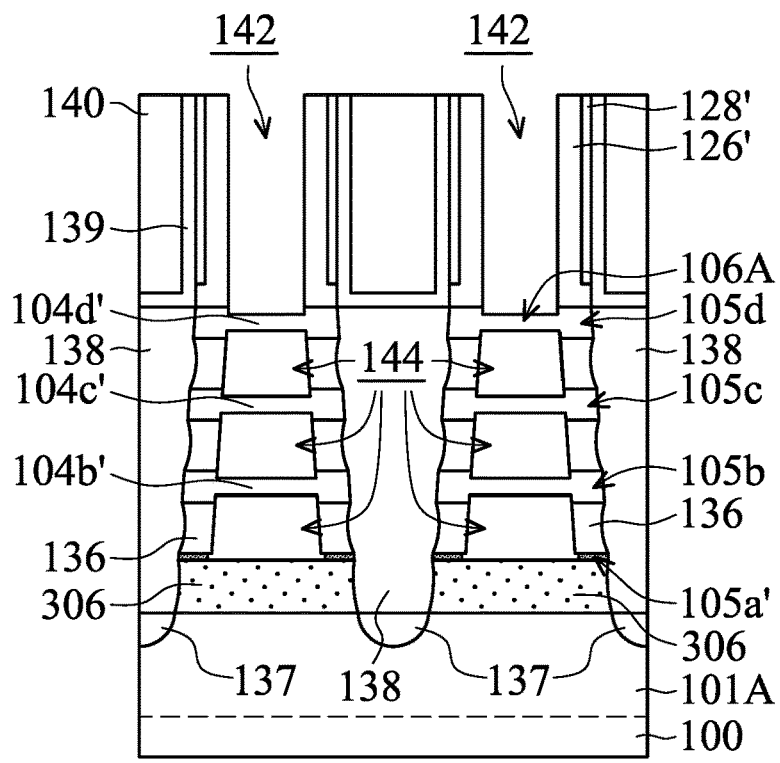

As shown in FIGS. 2I and 3M, the dielectric stressor structures 304 are annealed to form annealed dielectric stressor structures 306, in accordance with some embodiments. A thermal operation may be used to form the annealed dielectric stressor structures 306. The thermal operation may be performed at a temperature that is in a range from about 500 degrees C. to about 900 degrees C. Alternatively, the thermal operation may be performed at a temperature that is in a range from about 700 degrees C. to about 800 degrees C. The thermal operation time may be in a range from about 0.5 hours to about 4 hours. The thermal operation may be performed under an oxygen-containing atmosphere. The oxygen-containing atmosphere may include oxygen gas.

After the thermal operation, the dielectric stressor structures 304 may "shrink" and transformed into the annealed dielectric stressor structures 306. Compared with the dielectric stressor structures 304, the annealed dielectric stressor structures 306 may become denser. In some embodiments, each of the annealed dielectric stressor structures 306 becomes thinner than the dielectric stressor structures 304 that have not yet been transformed into the annealed dielectric stressor structures 306.

Due to the shrinkage that occurs during the transformation from the dielectric stressor structures 304 to the annealed dielectric stressor structures 306, the annealed dielectric stressor structures 306 may exert a tensile stress on the epitaxial structures 138, causing the epitaxial structures 138 beside the annealed dielectric stressor structures 306 to be slightly closer to each other. In response, the epitaxial structures 138 may exert a compressive stress on the semiconductor nanostructures 104b'-104d' that function as channel structures. As a result, the hole carrier mobility may be increased. The performance of the semiconductor device structure is thus significantly improved. In some embodiments, the semiconductor nanostructures 104b'-104d' function as the channel structures of a p-type MOSFET.

During the thermal operation for forming the annealed dielectric stressor structures 306, surface portions of the semiconductor nanostructures 104b'-104d' and the exposed semiconductor fins 101A and 101B may also be oxidized to form oxide elements 148, as shown in FIGS. 2I and 3M in accordance with some embodiments. The oxide elements 148 may be made of a material that is different than that of the annealed dielectric stressor structures 306. The oxide elements 148 may be made of or include silicon oxide, germanium oxide, one or more other suitable materials, or a combination thereof.

In some embodiments, during the thermal operation for forming the annealed dielectric stressor structures 306, the edge elements 105a are also oxidized to form oxidized edge elements 105a', as shown in FIG. 3M. The oxidized edge elements 105a' are dielectric elements that may be made of or include silicon oxide, germanium oxide, one or more other suitable materials, or a combination thereof. In some embodiments, each of the oxidized edge elements 105a' is in direct contact with the corresponding inner spacer 136, the corresponding epitaxial structure 138, and/or the corresponding annealed dielectric stressor structure 306, as shown in FIG. 3M.

Figure 2J:
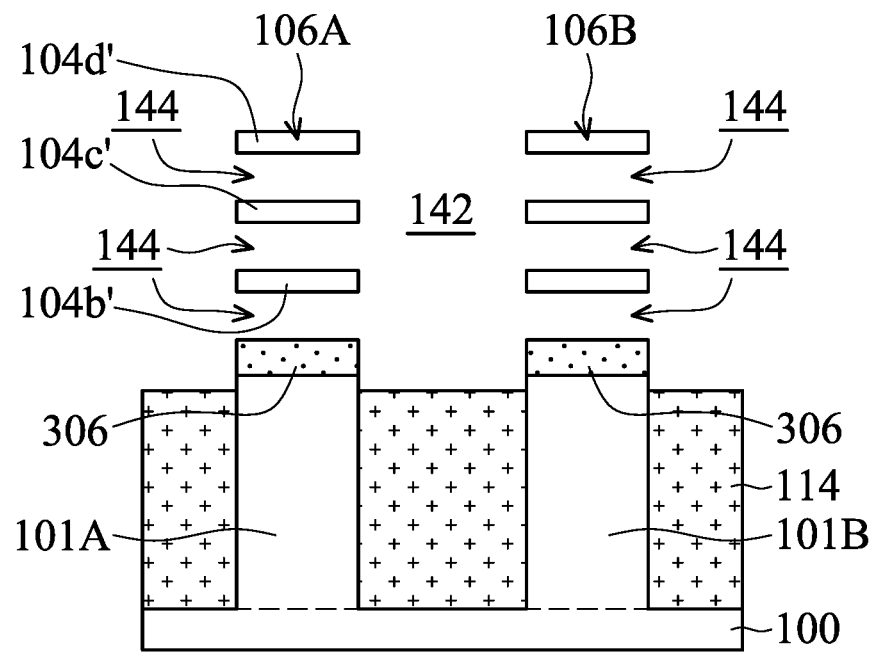

As shown in FIGS. 2J and 3N, the oxide elements 148 are removed, in accordance with some embodiments. After the removal of the oxide elements 148, the semiconductor nanostructures 104b'-104d' may become thinner or narrower. The oxide elements 148 may be removed using an etching process. The etching process may also partially remove the annealed dielectric stressor structures 306. The etching process may also partially remove the oxidized edge elements 105a', as shown in FIG. 3N. After the etching process, the oxidized edge elements 105a' retreat from the inner sidewalls of the inner spacers 136, as shown in FIG. 3N in accordance with some embodiments.

Figure 2K:
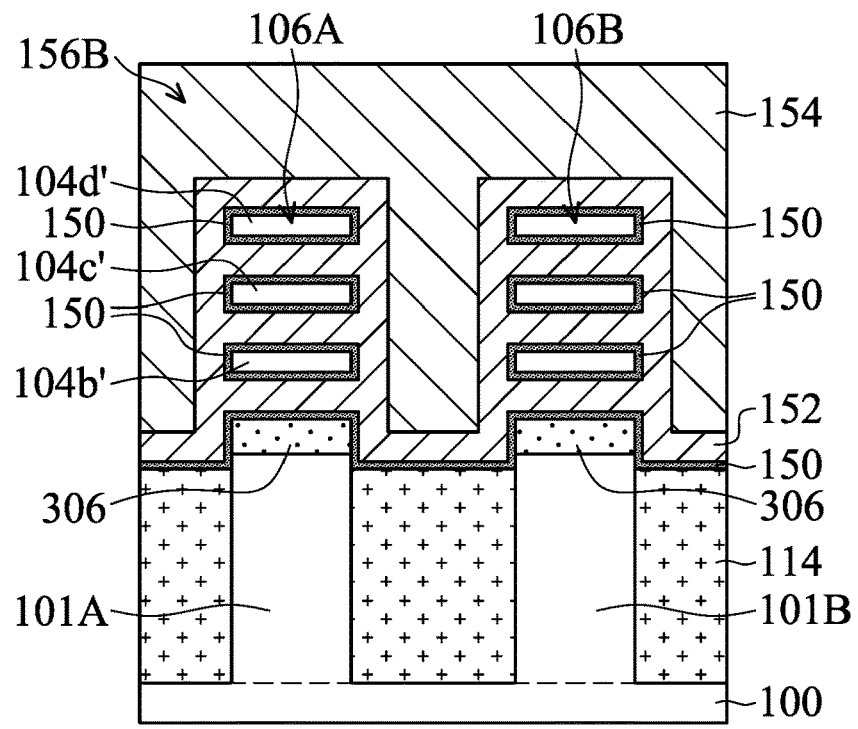
Figure 3O:
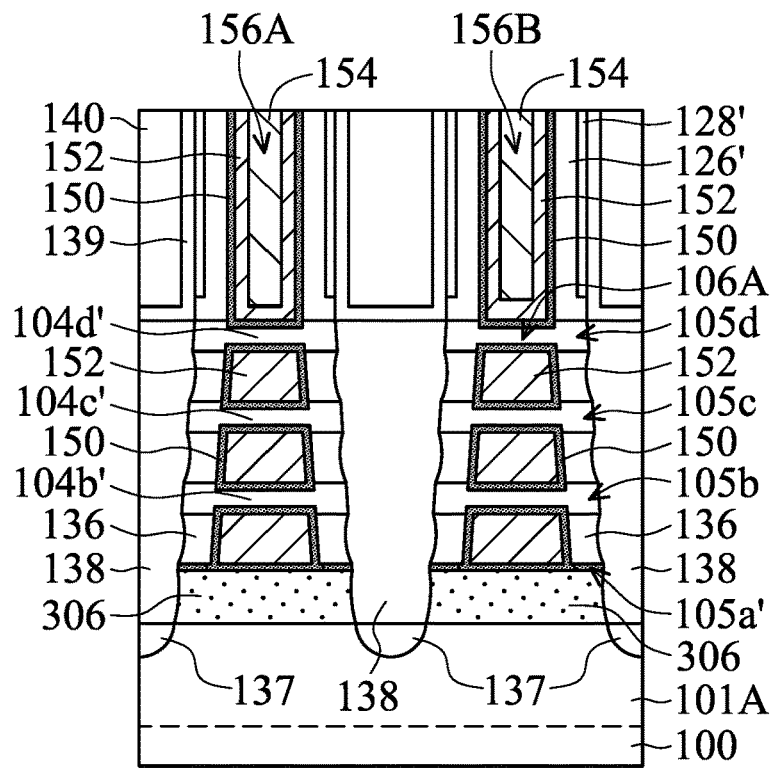

As shown in FIGS. 2K and 3O, metal gate stacks 156A and 156B are formed to fill the trenches 142, in accordance with some embodiments. The metal gate stacks 156A and 156B extend into the recesses 144 to wrap around each of the semiconductor nanostructures 104b'-104d'. In some embodiments, each of the annealed dielectric stressor structures 306 is in direct contact with the corresponding semiconductor fin 101A or 101B, the corresponding epitaxial structure 138, and/or the corresponding metal gate stack 156A or 156B, as shown in FIGS. 2K and 3O.

Each of the metal gate stacks 156A and 156B includes multiple metal gate stack layers. Each of the metal gate stacks 156A and 156B may include a gate dielectric layer 150, a work function layer 152, and a conductive filling 154. In some embodiments, the formation of the metal gate stacks 156A and 156B involves the deposition of multiple metal gate stack layers over the dielectric layer 140 to fill the trenches 142 and the recesses 144. The metal gate stack layers extend into the recesses 144 to wrap around each of the semiconductor nanostructures 104b'-104d'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104b'-104d'. The interfacial layers are very thin and are made of, for example, silicon oxide or germanium oxide. In some embodiments, the interfacial layers are formed by applying an oxidizing agent on the surfaces of the semiconductor nanostructures 104b'-104d'. For example, a hydrogen peroxide-containing liquid may be applied or provided on the surfaces of the semiconductor nanostructures 104b'-104d' so as to form the interfacial layers.

The work function layer 152 may be used to provide the desired work function for transistors to enhance device performance including improved threshold voltage. In some embodiments, the work function layer 152 is used for forming a PMOS device. The work function layer 152 is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

The work function layer 152 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 152 may be fine-tuned to adjust the work function level.

The work function layer 152 may be deposited over the gate dielectric layer 150 using an ALD process, a CVD process, a PVD process, an electroplating process, an electroless plating process, one or more other applicable processes, or a combination thereof.

In some embodiments, a barrier layer is formed before the work function layer 152 to interface the gate dielectric layer 150 with the subsequently formed work function layer 152. The barrier layer may also be used to prevent diffusion between the gate dielectric layer 150 and the subsequently formed work function layer 152. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive filling 154 are made of or include a metal material. The metal material may include tungsten, aluminum, copper, cobalt, one or more other suitable materials, or a combination thereof. A conductive layer used for forming the conductive filling 154 may be deposited over the work function layer 152 using a CVD process, an ALD process, a PVD process, an electroplating process, an electroless plating process, a spin coating process, one or more other applicable processes, or a combination thereof.

In some embodiments, a blocking layer is formed over the work function layer 152 before the formation of the conductive layer used for forming the conductive filling 154. The blocking layer may be used to prevent the subsequently formed conductive layer from diffusing or penetrating into the work function layer 152. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIGS. 2K and 3O. In some embodiments, the conductive filling 154 does not extend into the recesses 144 since the recesses 144 are small and have been filled with other elements such as the gate dielectric layer 150 and the work function layer 152. However, embodiments of the disclosure are not limited thereto. In some other embodiments, a portion of the conductive filling 154 extends into the recesses 144, especially for the lower recesses 144 that may have larger space.

In some embodiments, the epitaxial structures 138 extend exceeding the top surfaces of the annealed dielectric stressor structures 306. In some embodiments, the epitaxial structures 138 extend exceeding the interface between the annealed dielectric stressor structures 306 and the metal gate stack 156A or 156B. In some embodiments, the epitaxial structures 138 further extend exceeding the bottom surfaces of the annealed dielectric stressor structures 306. Therefore, the annealed dielectric stressor structures 306 may apply tensile stress on the epitaxial structures 138 easier. The epitaxial structures 138 may thus accordingly apply compressive stress on the semiconductor nanostructures 104b'-104d' that may function as channel structures. The performance of the semiconductor device structure is significantly improved.

In some embodiments, each of the annealed dielectric stressor structures 306 extends exceeding opposite edges of the corresponding metal gate stack 156A or 156B, as shown in FIG. 3O. The semiconductor nanostructures 104b'-104d' are positioned right above the corresponding annealed dielectric stressor structure 306. Each of the annealed dielectric stressor structures 306 itself may also help to apply compressive stress on the semiconductor nanostructures 104b'-104d'. The performance of the semiconductor device structure is significantly improved.

In some embodiments, the dielectric stressor structures 304 are annealed to form the annealed dielectric stressor structures 306 after the epitaxial structures 138 are formed. However, embodiments of the disclosure are not limited thereto. Many variations and/or modifications can be made to embodiments of the disclosure. In some other embodiments, the dielectric stressor structures 304 are annealed to form the annealed dielectric stressor structures 306 before the epitaxial structures 138 are formed.

Figure 4A:
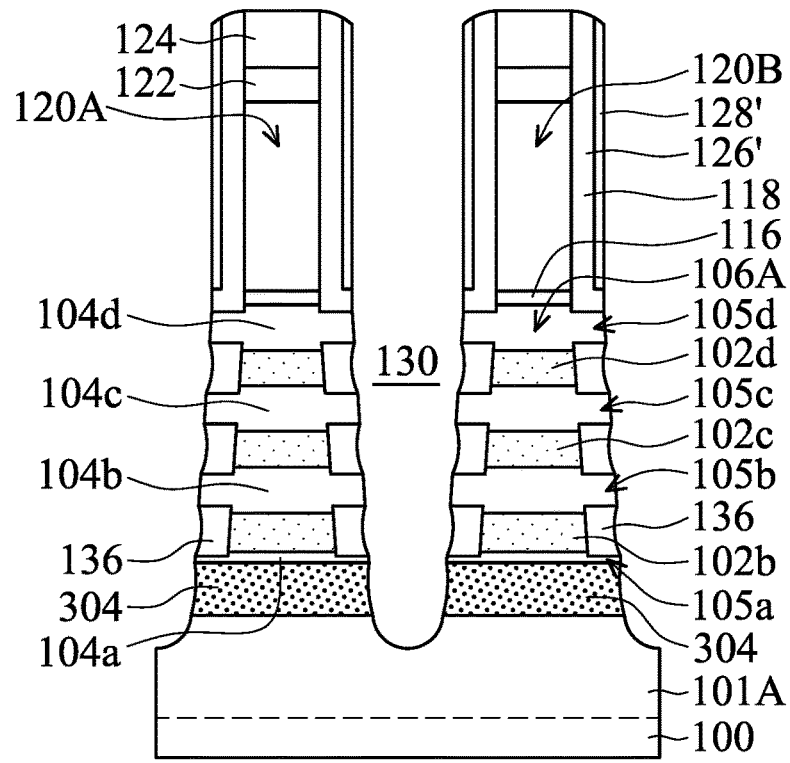
FIGS. 4A-4F are cross-sectional views of various stages of a process for forming a semiconductor device structure, in accordance with some embodiments.

FIGS. 4A-4F are cross-sectional views of various stages of a process for forming a semiconductor device structure, in accordance with some embodiments. As shown in FIG. 4A, a structure the same as or similar to that shown in FIG. 3H is formed or received.

Figure 4B:
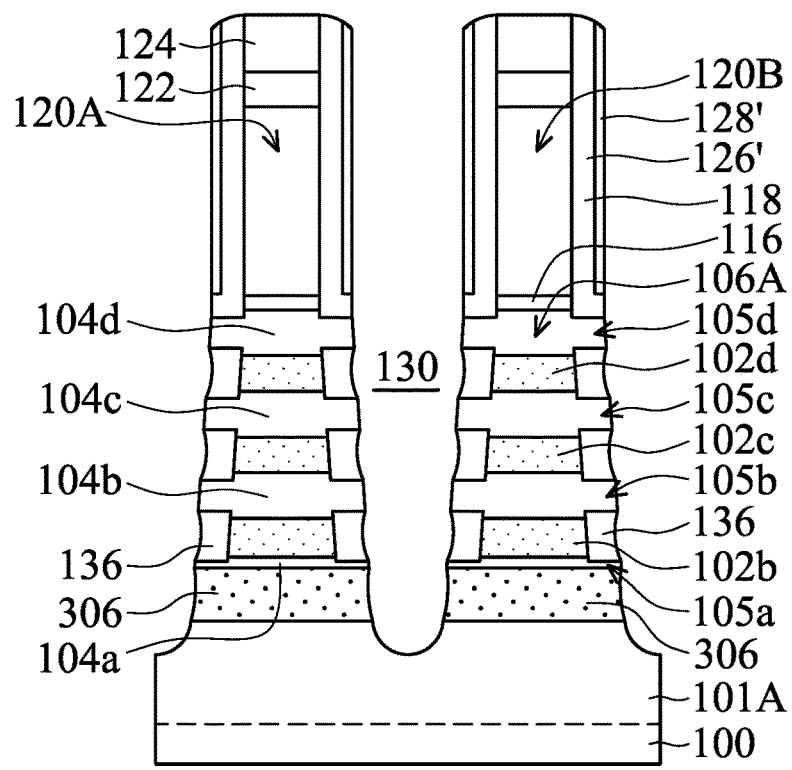

As shown in FIG. 4B, the dielectric stressor structures 304 are annealed to form the annealed dielectric stressor structures 306, in accordance with some embodiments. The thermal operation illustrated in FIGS. 2I and 3M may be used to form the annealed dielectric stressor structures 306. In some embodiments, the edge elements 105a are substantially not oxidized or slightly oxidized since the sidewall surfaces of the edge elements 105a exposed by the recesses 130 is very small.

Figure 4C:
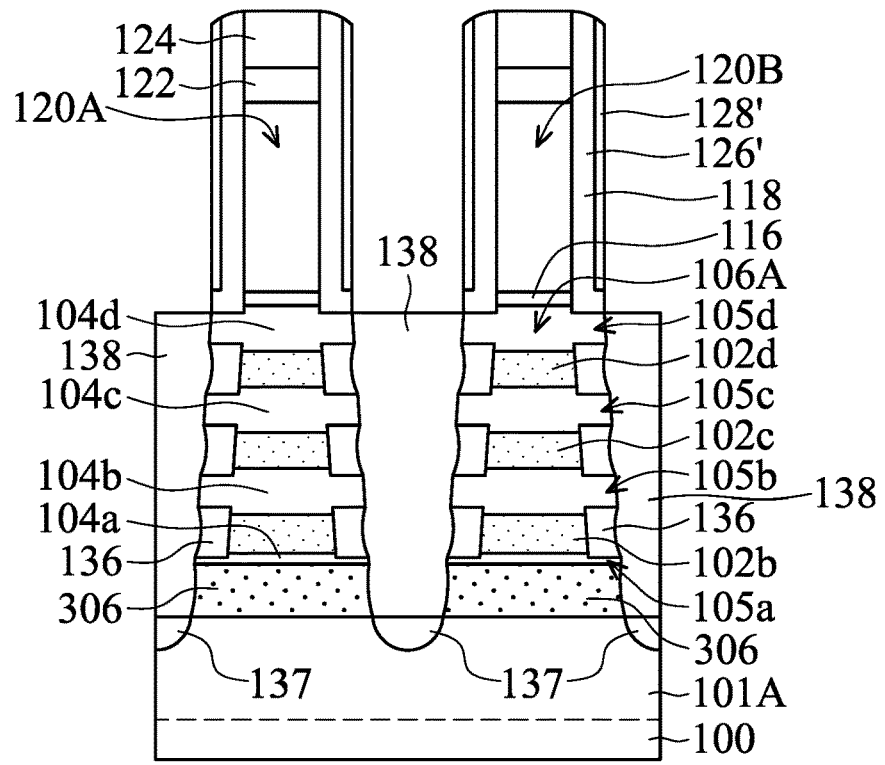
Figure 4D:
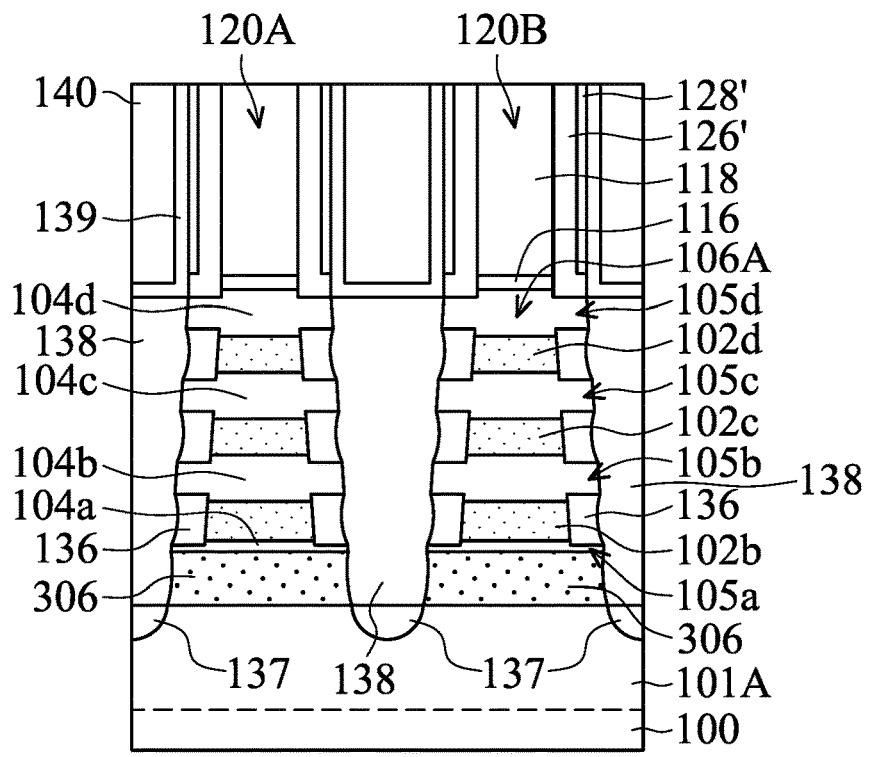

Afterwards, similar to the embodiments illustrated in FIG. 3I, the isolation elements 137 and the epitaxial structures 138 are formed, as shown in FIG. 4C in accordance with some embodiments. Then, similar to the embodiments illustrated in FIG. 3J, the contact etch stop layer 139 and the dielectric layer 140 are formed, as shown in FIG. 4D in accordance with some embodiments.

Figure 4E:
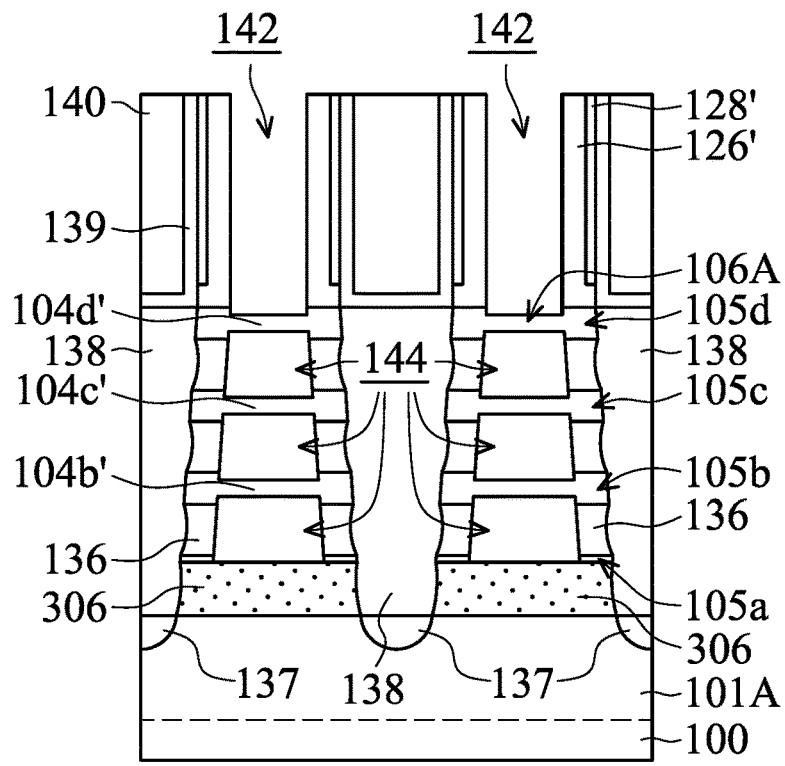

As shown in FIG. 4E, similar to the embodiments illustrated in FIGS. 3K-3L, the dummy gate stacks 120A and 120B and the semiconductor layers 102b-102d are removed, in accordance with some embodiments. As a result, the semiconductor nanostructures 104b'-104d' are formed. During the removal of the semiconductor layers 102b-102d, the semiconductor layer 104a is consumed, exposing the annealed dielectric stressor structures 306. In some embodiments, each of the edge elements 105a remains between the corresponding inner spacer 136 and the corresponding annealed dielectric stressor structure 306, as shown in FIG. 4E.

Figure 4F:
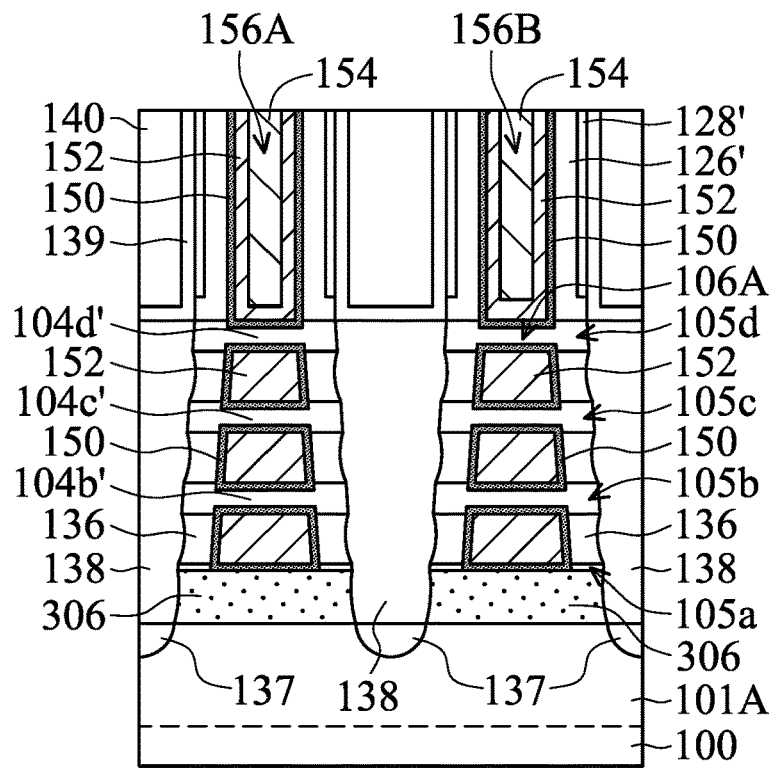

Afterwards, similar to the embodiments illustrated in FIG. 3O, the metal gate stacks 156A and 156B are formed, as shown in FIG. 4F in accordance with some embodiments. In some embodiments, each of the edge elements 105a is in direct contact with the corresponding annealed dielectric stressor structure 306 and the corresponding inner spacer 136.

However, embodiments of the disclosure are not limited thereto. In some other embodiments, a higher temperature or a longer operation time is used in the annealing process illustrated in FIG. 4B. The edge elements 105a are oxidized to form oxidized edge elements even if the exposed surface area of the edge elements 105a is small. As a result, after the subsequent processes, a structure the same as or similar to that shown in FIG. 3O is formed.

In some embodiments, each of the annealed dielectric stressor structures 306 is separated from the corresponding inner spacer 136 thereon by the oxidized edge element 105a' (such as that shown in FIG. 3O) or by the edge element 105a (such as that shown in FIG. 4F). However, embodiments of the disclosure are not limited thereto. Many variations and/or modifications can be made to embodiments of the disclosure. In some other embodiments, each of the annealed dielectric stressor structures 306 is in direct contact with one or more inner spacers 136.

Figure 5A:
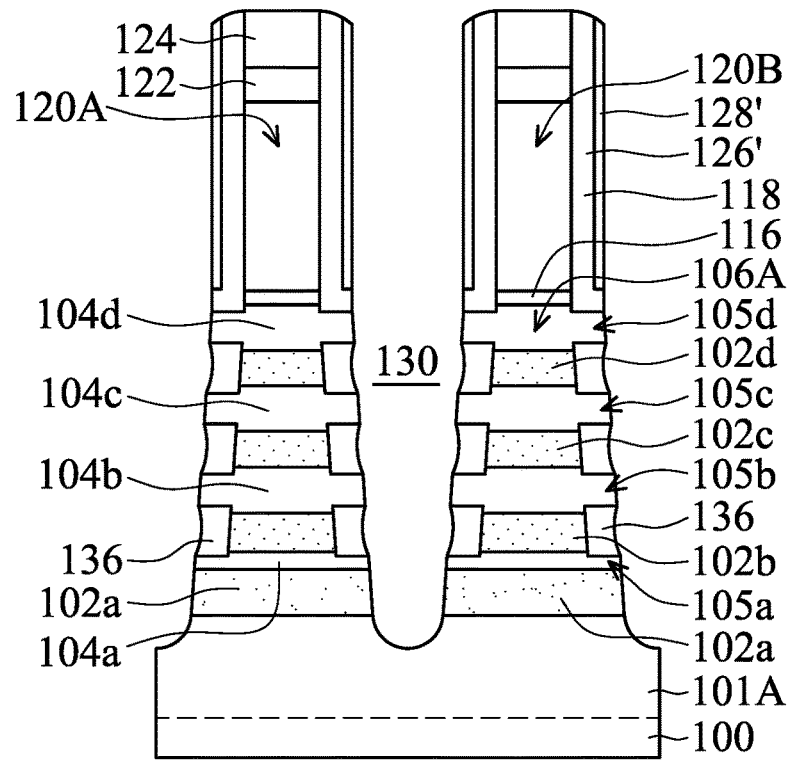
FIGS. 5A-5C are cross-sectional views of various stages of a process for forming a semiconductor device structure, in accordance with some embodiments.
Figure 5B:
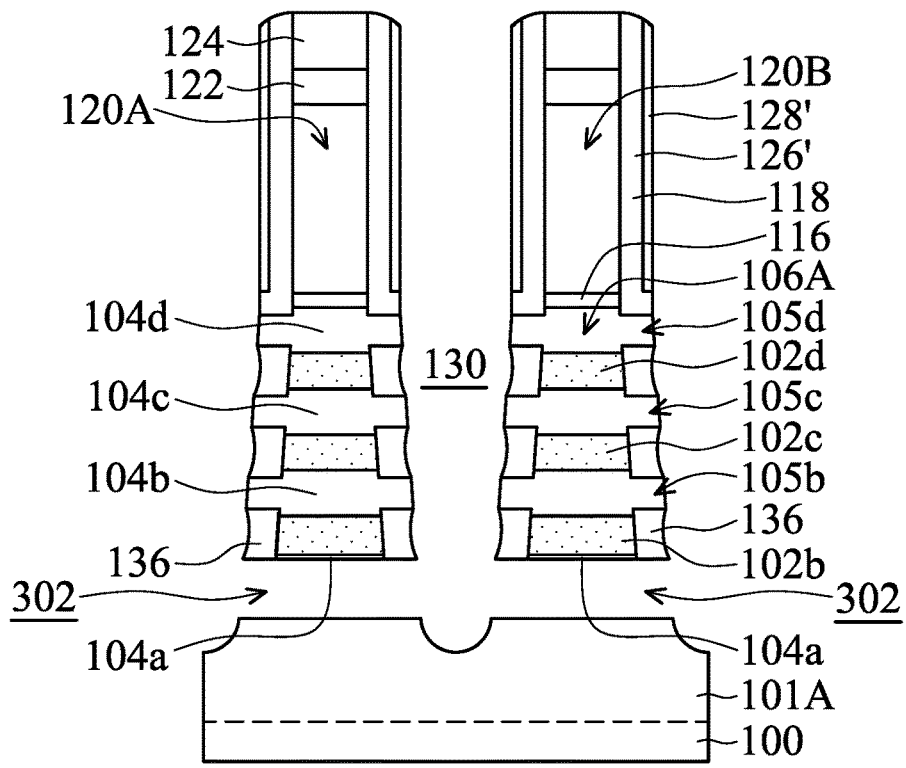
Figure 5C:
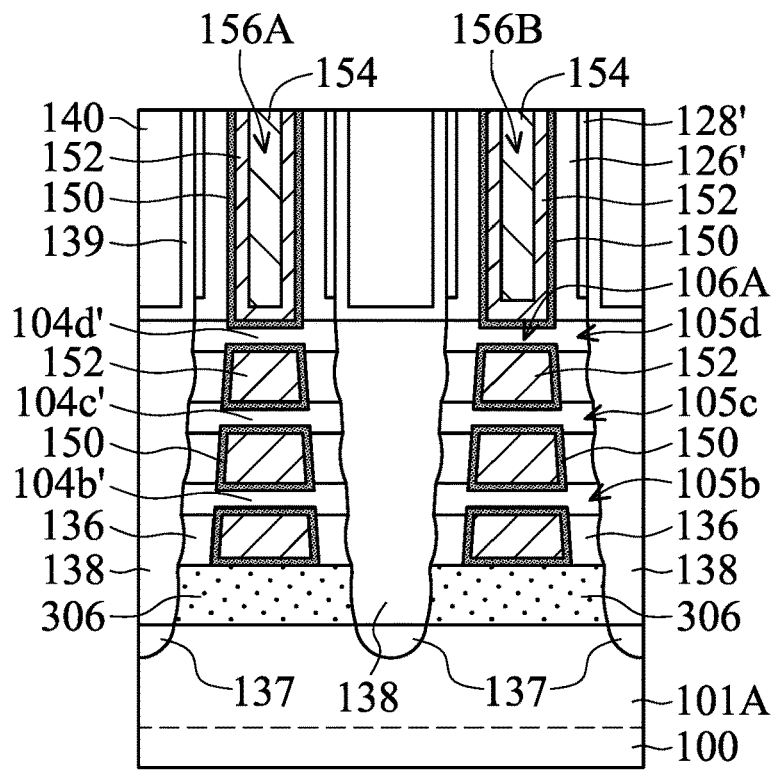

FIGS. 5A-5C are cross-sectional views of various stages of a process for forming a semiconductor device structure, in accordance with some embodiments. As shown in FIG. 5A, a structure the same as or similar to that shown in FIG. 3F is formed or received.

As shown in FIG. 5B, similar to the embodiments illustrated in FIG. 3G, the semiconductor layer 102a is removed to form the recesses 302, in accordance with some embodiments. Due to the protection of the inner spacers 136 and the semiconductor layer 104a (that function as a protective layer), the semiconductor layers 102b-102d are prevented from being etched during the removal of the semiconductor layer 102a. In some embodiments, the semiconductor layer 104a become thinner, and the edge elements 105a are removed since they are also etched during the removal of the semiconductor layer 102a, as shown in FIG. 5B. The bottom surfaces of some of the inner spacers 136 are exposed by the recesses 302 after the removal of the edge elements 105a, as shown in FIG. 5B.

Afterwards, the processes similar to those illustrated in FIG. 3H-3O or 4A-4F are performed, in accordance with some embodiments. As a result, the structure shown in FIG. 5C is formed. As shown in FIG. 5C, each of the annealed stressor structures 306 is in direct contact with some of the inner spacers 136, some of the epitaxial structures 138, and/or the semiconductor fin 101A or 101B.

Figure 6A:
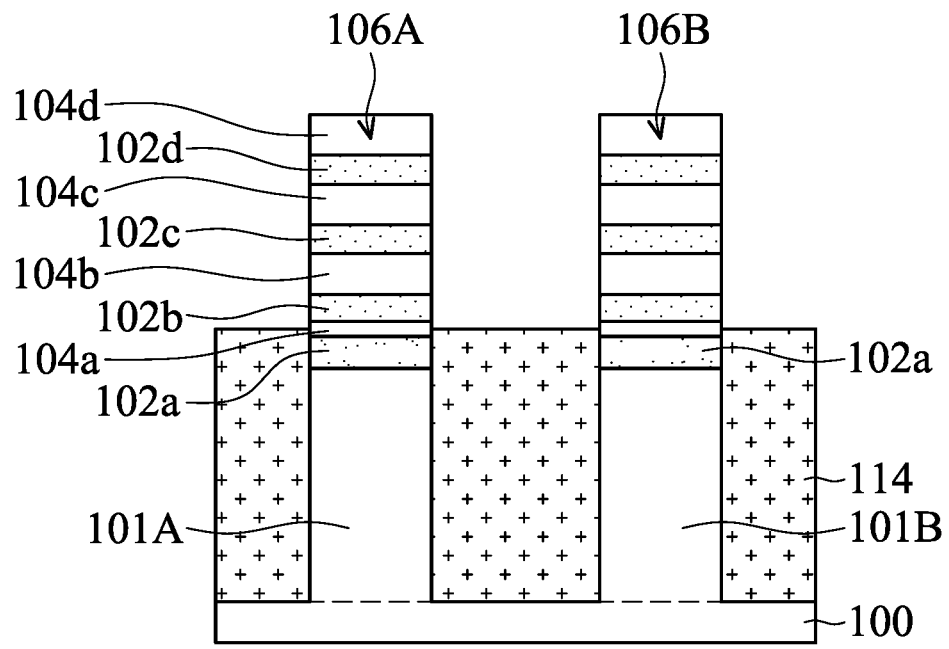
FIGS. 6A-6B are cross-sectional views of various stages of a process for forming a semiconductor device structure, in accordance with some embodiments.
Figure 6B:
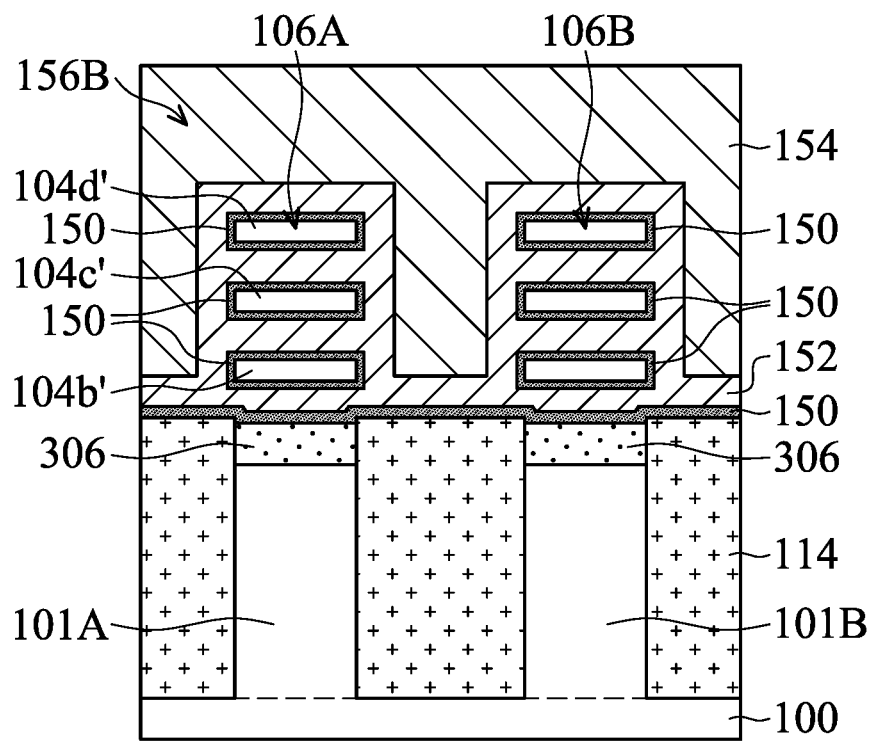

Many variations and/or modifications can be made to embodiments of the disclosure. FIGS. 6A-6B are cross-sectional views of various stages of a process for forming a semiconductor device structure, in accordance with some embodiments. As shown in FIG. 6A, a structure similar to that shown in FIG. 2C is formed. As shown in FIG. 6A, the top surface of the isolation structure 114 is higher than the top surface of the semiconductor layer 102a. Although the semiconductor layer 102a is covered by the semiconductor layer 104a and the isolation structure 114, the etchant for removing the semiconductor layer 102a may still reach the semiconductor layer 102a through the recesses 130 (similar to the embodiments illustrated in FIGS. 3F-3G).

Afterwards, the processes similar to those illustrated in FIGS. 2D-2K are performed, in accordance with some embodiments. As a result, the structure shown in FIG. 6B is formed. As shown in FIG. 6B, the top surface of the annealed dielectric stressor structure 306 is lower than the top surface of the isolation structure 114, in accordance with some embodiments.

Figure 7A:
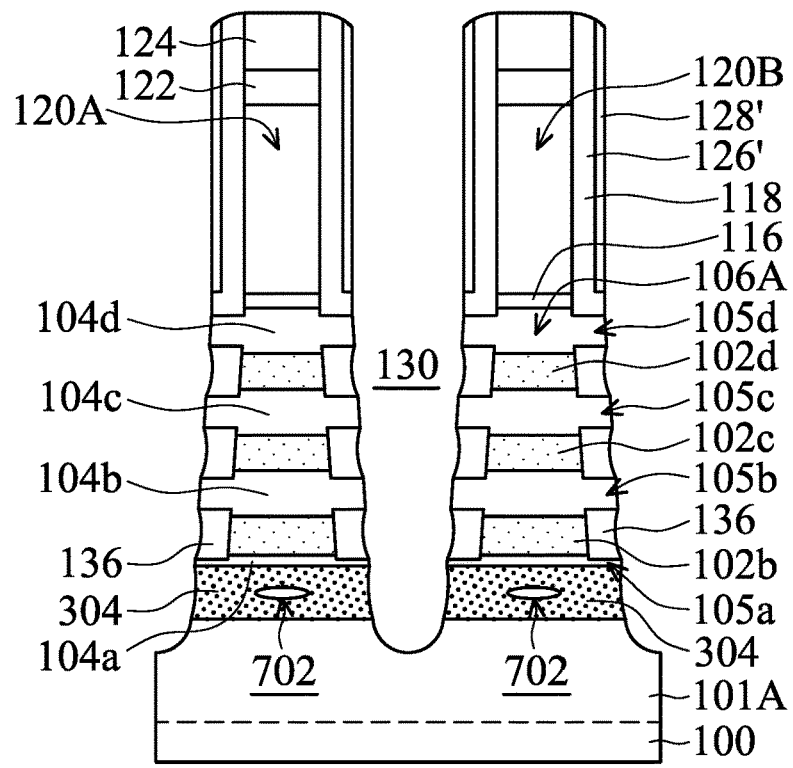
FIGS. 7A-7B are cross-sectional views of various stages of a process for forming a semiconductor device structure, in accordance with some embodiments.
Figure 7B:
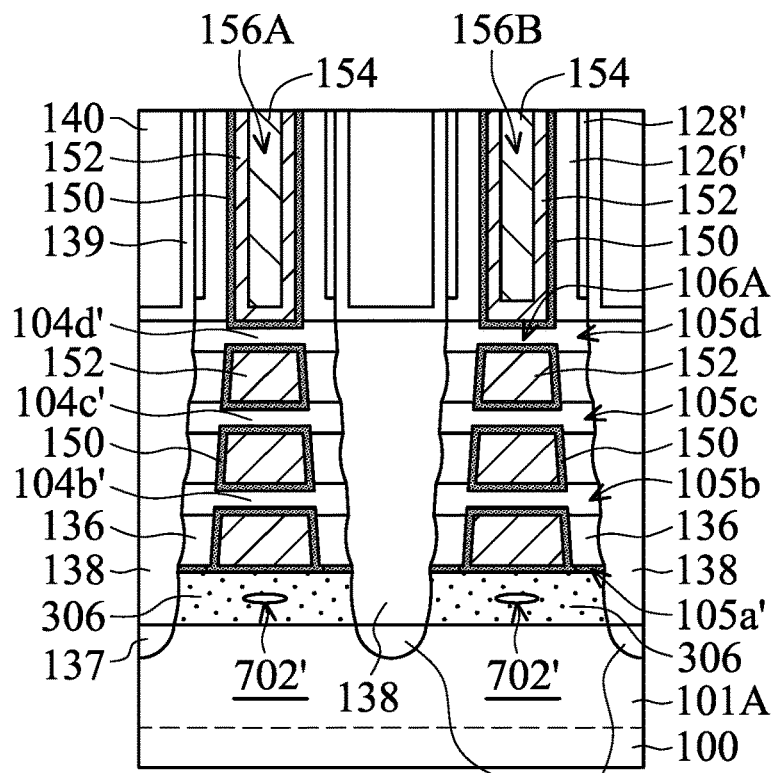

Many variations and/or modifications can be made to embodiments of the disclosure. FIGS. 7A-7B are cross-sectional views of various stages of a process for forming a semiconductor device structure, in accordance with some embodiments.

As shown in FIG. 7A, a structure similar to that shown in FIG. 3H is formed. In some embodiments, the dielectric stressor structures 304 do not completely fill the recesses 302. As a result, one or more seams 702 (or voids) may be formed in the dielectric stressor structures 304, as shown in FIG. 7A in accordance with some embodiments.

Afterwards, the processes similar to those illustrated in FIGS. 3I-3O are performed, in accordance with some embodiments. As a result, the structure shown in FIG. 7B is formed. As shown in FIG. 7B, the seams 702 (or voids) become smaller, and smaller seams 702' (or voids) are formed after the dielectric stressor structures 304 are annealed to become the annealed dielectric stressor structures 306, in accordance with some embodiments.

Embodiments of the disclosure form a semiconductor device structure with a dielectric stressor structure under a channel structure. The channel structure is wrapped around by a gate stack. For example, the semiconductor device structure includes a stack of multiple channel structures that are wrapped around by a metal gate stack. A dielectric stressor structure is formed below the channel structure. A thermal operation may be used to anneal the dielectric stressor structure. The dielectric stressor structure may induce epitaxial structures beside the channel structure to apply stress (such as compressive stress) to the channel structure. The dielectric stressor structure itself may also apply stress (such as compressive stress) to the channel structure. As a result, the carrier mobility in the channel structure may be improved. The performance and reliability of the semiconductor device structure are greatly improved.

In accordance with some embodiments, a semiconductor device structure is provided. The semiconductor device structure includes multiple semiconductor nanostructures over a substrate and two epitaxial structures over the substrate. Each of the semiconductor nanostructures is between the epitaxial structures, and the epitaxial structures are p-type doped. The semiconductor device structure also includes a gate stack wrapping around the semiconductor nanostructures. The semiconductor device structure further includes a dielectric stressor structure between the gate stack and the substrate. The epitaxial structures extend exceeding a top surface of the dielectric stressor structure.

In accordance with some embodiments, a semiconductor device structure is provided. The semiconductor device structure includes a semiconductor fin over a substrate and multiple channel structures suspended over the semiconductor fin. The semiconductor device structure also includes a gate stack wrapping around each of the channel structures. The semiconductor device structure further includes an epitaxial structure abutting the channel structures. In addition, the semiconductor device structure includes a dielectric stressor structure between the semiconductor fin and the gate stack. The dielectric stressor structure extends exceeding opposite edges of the gate stack.

In accordance with some embodiments, a method for forming a semiconductor device structure is provided. The method includes forming a sacrificial base layer over a semiconductor substrate and forming a semiconductor stack over the sacrificial base layer. The semiconductor stack has multiple sacrificial layers and multiple semiconductor layers laid out alternately. The method also includes patterning the semiconductor stack and the sacrificial base layer to form a fin structure and forming a dummy gate stack to wrap around a portion of the fin structure. The method further includes replacing the sacrificial base layer with a dielectric stressor structure. In addition, the method includes removing the dummy gate stack and the sacrificial layer to release multiple semiconductor nanostructures made up of remaining portions of the semiconductor layers. The method also includes forming a metal gate stack to wrap around each of the semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a sacrificial base layer over a semiconductor substrate;
   forming a semiconductor stack over the sacrificial base layer, wherein the semiconductor stack has a plurality of sacrificial layers and a plurality of semiconductor layers laid out alternately;
   patterning the semiconductor stack and the sacrificial base layer to form a fin structure;
   forming a dummy gate stack to wrap around a portion of the fin structure;
   replacing the sacrificial base layer with a dielectric stressor structure while the dummy gate stack wrap around portions of the sacrificial layers and portions of the semiconductor layers, wherein an entirety of the dielectric stressor structure is below a bottommost surface of the semiconductor layers;

removing the dummy gate stack and the sacrificial layer to release a plurality of semiconductor nanostructures made up of remaining portions of the semiconductor layers; and forming a metal gate stack to wrap around each of the semiconductor nanostructures.

2. The method for forming a semiconductor device structure as claimed in claim 1, further comprising:

partially removing the fin structure to form a recess exposing side surfaces of the semiconductor layers and the sacrificial layers;

forming inner spacers to cover the side surfaces of the sacrificial layers; and forming a source/drain structure to at least partially fill the recess after the inner spacers are formed.

3. The method for forming a semiconductor device structure as claimed in claim 2, further comprising annealing the dielectric stressor structure after the formation of the source/drain structure and before the formation of the metal gate stack.

4. The method for forming a semiconductor device structure as claimed in claim 2, further comprising annealing the dielectric stressor structure before the formation of the source/drain structure.

5. The method for forming a semiconductor device structure as claimed in claim 1, further comprising forming an isolation structure to surround a lower portion of the fin structure, wherein a top surface of the sacrificial base layer is higher than a top surface of the isolation structure.

6. The method for forming a semiconductor device structure as claimed in claim 1, wherein the sacrificial base layer has a first atomic concentration of germanium, the sacrificial layers have a second atomic concentration of germanium, and the first atomic concentration of germanium is lower than the second atomic concentration of germanium.

7. The method for forming a semiconductor device structure as claimed in claim 2, wherein the recess is formed before the replacing of the sacrificial base layer with the dielectric stressor structure.

8. The method for forming a semiconductor device structure as claimed in claim 7, wherein the recess exposes sidewalls of the sacrificial base layer before the replacing of the sacrificial base layer with the dielectric stressor structure.

9. The method for forming a semiconductor device structure as claimed in claim 7, wherein the recess exposes sidewalls of the dielectric stressor structure after the replacing of the sacrificial base layer with the dielectric stressor structure.

10. The method for forming a semiconductor device structure as claimed in claim 1, further comprising:

forming a protective layer over the sacrificial base layer before the semiconductor stack is formed, wherein the protective layer is thinner than each of the semiconductor layers; and partially removing the protective layer during the removal of the sacrificial layers such that the dielectric stressor structure is exposed.

11. The method for forming a semiconductor device structure as claimed in claim 1, wherein a seam is formed in the dielectric stressor structure, and the method further comprises:

annealing the dielectric stressor structure, wherein the seam becomes smaller after the annealing of the dielectric stressor structure.

12. A method for forming a semiconductor device structure, comprising:

forming a sacrificial base layer over a semiconductor substrate;

forming a semiconductor stack over the sacrificial base layer;

patterning the semiconductor stack and the sacrificial base layer to form a fin structure;

forming a gate stack to cover a portion of the fin structure;

replacing the sacrificial base layer with a dielectric stressor structure after the gate stack is formed and while the gate stack partially wraps around the fin structure, wherein the dielectric stressor structure is entirely below the semiconductor stack;

partially removing the fin structure to form a recess exposing side surfaces of the semiconductor stack and the dielectric stressor structure; and forming a source/drain structure to at least partially fill the recess.

13. The method for forming a semiconductor device structure as claimed in claim 12, further comprising annealing the dielectric stressor structure after the formation of the source/drain structure.

14. The method for forming a semiconductor device structure as claimed in claim 12, further comprising annealing the dielectric stressor structure before the formation of the source/drain structure.

15. The method for forming a semiconductor device structure as claimed in claim 12, wherein a void is formed in the dielectric stressor structure, and the method further comprises:

annealing the dielectric stressor structure, wherein the void becomes smaller after the annealing of the dielectric stressor structure.

16. The method for forming a semiconductor device structure as claimed in claim 12, wherein the source/drain structure is formed to be in direct contact with the dielectric stressor structure.

17. A method for forming a semiconductor device structure, comprising:

forming a fin structure over a substrate, wherein the fin structure has a plurality of sacrificial layers and a plurality of semiconductor layers laid out alternately;

forming a dummy gate stack to wrap around a portion of the fin structure;

forming a dielectric stressor structure between the fin structure and the substrate, wherein a topmost surface of the dielectric stressor structure is between the substrate and a bottommost surface of the semiconductor layers of the fin structure;

removing the dummy gate stack and the sacrificial layer to release a plurality of semiconductor nanostructures made up of remaining portions of the semiconductor layers; and forming a metal gate stack to wrap around the semiconductor nanostructures.

18. The method for forming a semiconductor device structure as claimed in claim 17, further comprising:

partially removing the fin structure to form a recess exposing side surfaces of the sacrificial layers, the semiconductor layers, and the dielectric stressor structure; and forming a source/drain structure to at least partially fill the recess.

19. The method for forming a semiconductor device structure as claimed in claim 18, wherein the source/drain structure is formed to be in direct contact with the dielectric stressor structure, and the method further comprises:

annealing the dielectric stressor structure after the source/drain structure is formed and before the metal gate stack is formed.

20. The method for forming a semiconductor device structure as claimed in claim 17, wherein a void is formed in the dielectric stressor structure, and the method further comprises:

annealing the dielectric stressor structure, wherein the void becomes smaller after the annealing of the dielectric stressor structure.

\* \* \* \* \*